(12) United States Patent
Arena et al.

(10) Patent No.: US 8,574,968 B2
(45) Date of Patent: Nov. 5, 2013

(54) EPITAXIAL METHODS AND TEMPLATES GROWN BY THE METHODS

(75) Inventors: Chantal Arena, Mesa, AZ (US); Christiaan J. Werkhoven, Gilbert, AZ (US); Ronald Thomas Bertram, Jr., Mesa, AZ (US); Ed Lindow, Scottsdale, AZ (US); Subhash Mahajan, Tempe, AZ (US); Ranjan Datta, Tempe, AZ (US); Rahul Ajay Trivedi, Tempe, AZ (US); Ilsu Han, Tempe, AZ (US)

(73) Assignees: Soitec, Bernin (FR); Arizona Board of Regents for and on Behalf of Arizona State University, Scottsdale, AZ (US)

( * ) Notice: Subject to any disclaimer, the term of this patent is extended or adjusted under 35 U.S.C. 154(b) by 361 days.

(21) Appl. No.: 12/180,418

(22) Filed: Jul. 25, 2008

(65) Prior Publication Data
US 2009/0098343 A1    Apr. 16, 2009

Related U.S. Application Data

(60) Provisional application No. 60/952,131, filed on Jul. 26, 2007.

(51) Int. Cl.
*H01L 21/82* (2006.01)
(52) U.S. Cl.
USPC ............. 438/129; 257/E21.04; 257/E21.09; 438/172; 438/481
(58) Field of Classification Search
USPC .............. 438/172, 481, 341; 257/E21.04, 257/E21.09; 117/45, 923
See application file for complete search history.

(56) References Cited

U.S. PATENT DOCUMENTS

| | | | | |
|---|---|---|---|---|
| 4,549,926 A | * | 10/1985 | Corboy et al. | 438/412 |
| 5,156,995 A | * | 10/1992 | Fitzgerald et al. | 438/494 |
| 5,308,445 A | * | 5/1994 | Takasu | 117/90 |

(Continued)

FOREIGN PATENT DOCUMENTS

| | | |
|---|---|---|
| JP | 2001-520160 A | 10/2001 |
| JP | 2001520169 A | 10/2001 |

(Continued)

OTHER PUBLICATIONS

Beaumont et al., "Epitaxial Lateral Overgrowth of GaN," Phys. Stat. Sol. (b) 227(1): 1-43 (2001).

(Continued)

*Primary Examiner* — N Drew Richards
*Assistant Examiner* — Ankush Singal
(74) *Attorney, Agent, or Firm* — Winston & Strawn LLP

(57) ABSTRACT

This invention provides methods for fabricating substantially continuous layers of a group III nitride semiconductor material having low defect densities and optionally having a selected crystal polarity. The methods include epitaxial growth nucleating and/or seeding on the upper portions of a plurality of pillars/islands of a group III nitride material that are irregularly arranged on a template structure. The upper portions of the islands have low defect densities and optionally have a selected crystal polarity. The invention also includes template structures having a substantially continuous layer of a masking material through which emerge upper portions of the pillars/islands. The invention also includes such template structures. The invention can be applied to a wide range of semiconductor materials, both elemental semiconductors, e.g., combinations of Si (silicon) with strained Si (sSi) and/or Ge (germanium), and compound semiconductors, e.g., group II-VI and group III-V compound semiconductor materials.

19 Claims, 9 Drawing Sheets

(56) References Cited

U.S. PATENT DOCUMENTS

| | | | |
|---|---|---|---|
| 5,389,571 A * | 2/1995 | Takeuchi et al. | 117/89 |
| 5,861,707 A * | 1/1999 | Kumar | 313/309 |
| 5,926,726 A * | 7/1999 | Bour et al. | 438/507 |
| 6,008,126 A * | 12/1999 | Leedy | 438/667 |
| 6,153,010 A * | 11/2000 | Kiyoku et al. | 117/95 |
| 6,225,650 B1 * | 5/2001 | Tadatomo et al. | 257/190 |
| 6,252,261 B1 * | 6/2001 | Usui et al. | 257/190 |
| 6,320,209 B1 * | 11/2001 | Hata et al. | 257/190 |
| 6,325,852 B1 | 12/2001 | Theodore et al. | 117/209 |
| 6,365,491 B1 * | 4/2002 | Martin et al. | 438/479 |
| 6,448,183 B1 * | 9/2002 | Lee | 438/701 |
| 6,468,347 B1 * | 10/2002 | Motoki et al. | 117/89 |
| 6,478,871 B1 * | 11/2002 | Shealy et al. | 117/84 |
| 6,596,377 B1 * | 7/2003 | Hersee et al. | 428/195.1 |
| 6,623,560 B2 * | 9/2003 | Biwa et al. | 117/95 |
| 6,794,210 B2 * | 9/2004 | Ouchi et al. | 438/46 |
| 6,794,276 B2 | 9/2004 | Letertre et al. | 438/506 |
| 6,809,351 B2 * | 10/2004 | Kuramoto et al. | 257/190 |
| 6,890,785 B2 * | 5/2005 | Goto et al. | 438/46 |
| 6,967,359 B2 * | 11/2005 | Kamiyama et al. | 257/190 |
| 6,989,287 B2 * | 1/2006 | Fujikura et al. | 438/47 |
| 7,033,436 B2 * | 4/2006 | Biwa et al. | 117/89 |
| 7,052,979 B2 * | 5/2006 | Nagai et al. | 438/478 |
| 7,091,514 B2 * | 8/2006 | Craven et al. | 257/14 |
| 7,095,062 B2 * | 8/2006 | Linthicum et al. | 257/103 |
| 7,186,302 B2 * | 3/2007 | Chakraborty et al. | 148/33 |
| 7,361,576 B2 * | 4/2008 | Imer et al. | 438/479 |
| 7,445,673 B2 * | 11/2008 | Beaumont et al. | 117/94 |
| 7,455,729 B2 * | 11/2008 | Beaumont et al. | 117/84 |
| 7,491,984 B2 * | 2/2009 | Koike et al. | 257/190 |
| 7,511,311 B2 * | 3/2009 | Kususe et al. | 257/ |
| 7,560,364 B2 * | 7/2009 | Bour et al. | 438/481 |
| 7,566,580 B2 * | 7/2009 | Keller et al. | 438/46 |
| 7,615,452 B2 * | 11/2009 | Sato | 438/270 |
| 7,713,812 B2 * | 5/2010 | Ueda et al. | 438/240 |
| 7,732,306 B2 | 6/2010 | Arena et al. | 438/481 |
| 8,070,966 B2 * | 12/2011 | Chowdhury et al. | 216/11 |
| 8,425,858 B2 * | 4/2013 | LeBoeuf et al. | 422/400 |
| 2002/0011599 A1 * | 1/2002 | Motoki et al. | 257/76 |
| 2002/0043208 A1 * | 4/2002 | Biwa et al. | 117/94 |
| 2002/0098641 A1 * | 7/2002 | Tsuda et al. | 438/506 |
| 2002/0098693 A1 * | 7/2002 | Kong et al. | 438/687 |
| 2002/0102830 A1 * | 8/2002 | Ishida | 438/604 |
| 2002/0168844 A1 * | 11/2002 | Kuramoto et al. | 438/604 |
| 2003/0087467 A1 * | 5/2003 | Oohata et al. | 438/479 |
| 2003/0119239 A1 * | 6/2003 | Koike et al. | 438/200 |
| 2003/0227026 A1 * | 12/2003 | Goto et al. | 257/103 |
| 2004/0057482 A1 * | 3/2004 | Wang | 372/45 |
| 2004/0067648 A1 * | 4/2004 | Morita et al. | 438/689 |
| 2004/0137732 A1 * | 7/2004 | Frayssinet et al. | 438/689 |
| 2004/0150001 A1 * | 8/2004 | Shchukin et al. | 257/183 |
| 2004/0266157 A1 * | 12/2004 | Lugauer et al. | 438/602 |
| 2005/0037526 A1 * | 2/2005 | Kamiyama et al. | 438/22 |
| 2005/0064206 A1 * | 3/2005 | Akita et al. | 428/446 |
| 2005/0092234 A1 * | 5/2005 | Motoki et al. | 117/91 |
| 2005/0093099 A1 * | 5/2005 | Koike et al. | 257/615 |
| 2005/0161697 A1 * | 7/2005 | Nakahata et al. | 257/103 |
| 2005/0183658 A1 * | 8/2005 | Nakahata et al. | 117/2 |
| 2006/0073680 A1 * | 4/2006 | Han et al. | 438/479 |
| 2006/0099781 A1 * | 5/2006 | Beaumont et al. | 438/509 |
| 2006/0166390 A1 | 7/2006 | Letertre et al. | 438/34 |
| 2006/0237739 A1 * | 10/2006 | Shono et al. | 257/98 |
| 2006/0252236 A1 * | 11/2006 | Chen et al. | 438/481 |
| 2006/0258027 A1 * | 11/2006 | Ohmae et al. | 438/22 |
| 2006/0270076 A1 * | 11/2006 | Imer et al. | 438/22 |
| 2006/0272572 A1 * | 12/2006 | Uematsu et al. | 117/84 |
| 2007/0026643 A1 * | 2/2007 | Tadatomo et al. | 438/478 |
| 2007/0054476 A1 * | 3/2007 | Nakahata et al. | 438/483 |
| 2007/0184637 A1 * | 8/2007 | Haskell et al. | 438/481 |
| 2007/0218703 A1 * | 9/2007 | Kaeding et al. | 438/775 |
| 2007/0259464 A1 | 11/2007 | Bour et al. | 438/22 |
| 2007/0259504 A1 * | 11/2007 | Bour et al. | 438/341 |
| 2007/0280872 A1 * | 12/2007 | Okahisa et al. | 423/409 |
| 2008/0001165 A1 * | 1/2008 | Hashimoto et al. | 257/103 |
| 2008/0006201 A1 * | 1/2008 | Hirota et al. | 117/90 |
| 2008/0096389 A1 * | 4/2008 | Feng et al. | 438/692 |
| 2008/0135853 A1 * | 6/2008 | Craven et al. | 257/76 |
| 2008/0187018 A1 * | 8/2008 | Li | 372/50.11 |
| 2009/0289261 A1 * | 11/2009 | Sato et al. | 257/76 |
| 2010/0187568 A1 * | 7/2010 | Arena | 257/190 |

FOREIGN PATENT DOCUMENTS

| | | |
|---|---|---|
| JP | 2004-531889 A | 10/2004 |
| JP | 2004363500 A | 12/2004 |
| JP | 2005-534182 A | 11/2005 |
| JP | 2007502546 A | 2/2007 |
| WO | WO 99/20816 | 4/1999 |
| WO | WO 02/44444 A1 | 6/2002 |
| WO | WO 02/090625 A1 | 11/2002 |
| WO | WO 2007/068756 A1 | 6/2007 |

OTHER PUBLICATIONS

Lahrèche et al., "Growth of high-quality GaN by low-pressure metalorganic vapour phase epitaxy (LP-MOVPE) from 3D islands and lateral overgrowth," Journal of Crystal Growth 205: 245-252 (1999).

Napierala et al., "Stress control in GaN/sapphire templates for the fabrication of crack-free thick layers," Journal of Crystal Growth 289: 445-449 (2006).

International Search Report and the Written Opinion of the International Searching Authority, application No. PCT/US2008/071219, dated Dec. 11, 2008.

International Search Report for PCT/US2008/071219.

M. Sumiya et al., "Review of polarity determination and control of GaN", MRS Internet J. Nitride Semicond. Res. 9, 1, pp. 1-34 and pp. 1-15 of Figures (2004).

K. Dovidenko et al,., "Study of Thin Films Polarity of Group Iii Nitrides", MRS Internet J. Nitride Semicond. Res. 4S1, G6.46 (1999).

M. Stutzmann et al., "Playing with Polarity", Phys. Stat. Sol.(b), vol. 228, No. 2, pp. 505-512 (2001).

F. Dwikusuma et al., "X-ray photoelectron spectroscopic study on sapphire nitridation for GaN growth by hydride vapor phase epitaxy: Nitridation mechanism", Journal of Applied Physics, vol. 94, No. 9, pp. 5656-5664 (2003).

Shinya Bohyama et al., "Freestanding GaN Substrate by Advanced Facet-Controlled Epitaxial Lateral Overgrowth Technique with Masking Side Facets", Japanese Journal of Applied Physics, vol. 44, No. 1, pp. L 24-L 26 (2005).

S. Haffouz et al, "The effect of the Si/N treatment of a nitridated sapphire surface on the growth mode of GaN in low-pressure metalorganic vapor phase epitaxy", Applied Physics Letters, vol. 73, No. 9, pp. 1278-1280 (1998).

X. L. Fang et al., "Reduction of threading dislocations in GaN layers using in situ deposited silicon nitride masks on AlN and GaN nucleation layers", Applied Physics Letters, vol. 84, No. 4, pp. 484-486 (2004).

Pierre Gibart, "Metal organic vapour phase epitaxy of GaN and lateral overgrowth", Institute of Physics Publishing Reports on Progress in Physics, Rep. Prog. Phys., vol. 67, pp. 667-715 (2004).

\* cited by examiner

EPITAXIAL METHODS AND TEMPLATES GROWN BY THE METHODS

CROSS-REFERENCE TO RELATED APPLICATIONS

This application claims the benefit of U.S. Provisional Application No. 60/952,131 filed Jul. 26, 2007, which is included by reference herein in its entirety for all purposes.

FIELD OF THE INVENTION

The present invention relates to the field of processing semiconductor materials, and in particular to the field of epitaxial growth of high-quality, mono-crystalline layers of semiconductor materials. The invention provides epitaxial methods which, in preferred embodiments, combine damascene techniques with epitaxial lateral overgrowth (ELO) techniques. The invention also provides templates and semiconductors fabricated by the provided Damascene-ELO™ methods.

BACKGROUND OF THE INVENTION

To be suitable for device fabrication, layers of semiconductor materials must be of high purity and have low densities of defects or dislocations. Preparation of quality layers of certain materials, especially compound materials, has been hindered in the past because of a lack of quality bulk single crystals and also due to inadequate substrates for hetero-epitaxial growth.

Such problems have hindered the development of gallium nitride (GaN); of other Group III nitrides, including, e.g., AlN, InN, GaInN, and other mixed nitrides (referred to herein as "III nitrides"); of certain Group III-V compounds; and of certain other compound materials (e.g., II-VI materials) generally. For example, the III nitrides have semiconductor properties that are advantageous for fabrication of electronic components (e.g., high temperature FETs), optic components (e.g., short wavelength LEDs and lasers), and mixed optoelectronic components (e.g. photovoltaic devices). However, the preparation of quality layers of the aforementioned materials has been hindered by a lack of quality bulk crystals and/or suitable substrates that match the crystal properties of these materials. A substrate that does not closely match the crystal properties of the materials to be grown thereon can lead to an unacceptable density of defects and dislocations (for GaN, particularly threading dislocations (TD) originating at the interface between the substrate and the GaN).

In the case of GaN, it should be noted that crystal quality can be improved by substrate pre-treatment such as chemical modification of the substrate surface, e.g., by nitrodization; growing, often at lower temperatures (LT), a thin buffer layer of, e.g., AlN or GaN, thermal annealing, and the like. Crystal quality has also been improved by exploiting epitaxial lateral overgrowth (ELO), during which a layer grows laterally over a masking layer as well as vertically from the substrate. See, e.g., U.S. Pat. No. 6,153,010. Known ELO processes grow GaN on substrates that are partially covered by a photo-lithographically patterned mask and under conditions promoting, first, growth on the regions of the substrate exposed through the mask opening, and second, growth laterally over the mask Also, such problems have hindered the development of alloys of silicon (Si) and germanium (Ge). Such bulk crystals are generally not available. However, improved crystal quality has been obtained by growing these materials on buffer layers having a composition that grades from that of the substrate (e.g., Si or Ge) to that of the material to be grown (e.g., SiGe).

In addition to defect or dislocation density, another important crystal property, especially for the III nitrides (e.g., GaN), is "crystal polarity", See, e.g., Sumiya et al., 2004, Review of polarity determination and control of GaN, *MRS Internet J. Nitride Semicond. Res.* 9, 1. GaN crystal polarity is illustrated in FIG. 1 (where Ga atoms are illustrated by large grey spheres, N atoms are illustrated by small black spheres, and bonds are illustrated by double lines). As illustrated, in wurtzite GaN (and the other III nitrides) each Ga atom is tetrahedrally coordinated to four nitrogen (N) atoms, but of these, it is strongly bonded only to the three nearest-neighbor Ns (indicated in FIG. 1 by "*"). If the three strong bonds from a Ga to its three nearest-neighbor Ns are directed downward towards the substrate, then the polarity is +c (also known as Ga-face), where the label c refers to the crystal plane perpendicular to the plane of the epitaxial film. For the opposite polarity −c (also referred to N-face), the direction of the Ga to its three nearest-neighbor Ns is directed upwards towards the growth direction.

It is important to note that the polarity of the material is not a surface property and seriously affects the bulk properties of the GaN (or other nitride material) and it is often advantageous to fabricate components in one or the other polarity. Therefore it is often desirable to select the polarity of the epitaxial growth layer to tailor it to a specific application, for example layers with +c polarity are often preferred for III nitride component fabrication.

A further important crystal parameter, especially for hetero-epitaxial growth of III-V nitride films, is the induced strain in the epitaxial layer resulting from the lattice mismatch between a non-native substrate and the nitride layer (e.g. ≈15% between Sapphire and GaN). The strain induced in the nitride epitaxial layer can manifest itself physically in a number of significant ways, including but not limited to defect/dislocation formation, compositional phase separation and internal polarization field creation.

Phase separation and piezoelectric field creation have a detrimental effect on light emitting devices fabricated from the III nitride materials system, in particular for active layers grown from the InGaN material. The components of the binary compound InGaN, namely InN and the GaN are not fully miscible and therefore under a given set of growth conditions and film thickness there exists a fixed range of energetically favorable InGaN compositions. The introduction of lattice strain and defects into the InGaN system can result in thicker InGaN layers grown at energetically unfavorable compositions tending to phase separate i.e. the In and Ga atoms will not be homogenously distributed throughout the layer. The non-homogeneity can result in a distributed perturbation of the band-gap energy of the material i.e. the phase separated regions can act disproportionately as optical absorption centers or optical scattering sources, which can result in a deterioration of the internal quantum efficiency (IQE) of the nitride device. The IQE, the number of photons generated within the active layer divided by the number of electrons pumped into the device, has been observed to decrease rapidly with increasing indium component in the InGaN active region and this phenomena has been related to the phase separation of the material. The decrease in IQE has considerable implications for applications where a large indium component would be required, for example, long wavelength emitters fabricated from III nitride materials.

The combination of the wurtzite crystal structure of the III nitrides and the common growth orientation in the (0001)

plane produces polarization fields in the material. The polarization fields subsequently produce electrostatic charge densities in the material that have an influence on carrier distribution and electric fields in nitride devices. The polarization fields in the nitrides have been shown to originate from two separate components, composition related (spontaneous) and strain related (piezoelectric). The induced charges cause interface energy barriers that can impede the transport of electron and holes into the active region of a device. The spontaneous and piezoelectric polarizations separate the electron and hole spatial distribution due to an incline of the band structure, this separation of carriers results in a significant reduction in the efficiency of the device.

SUMMARY OF THE INVENTION

The present invention provides methods for epitaxial growth of low-defect-density, reduced lattice strain, monocrystalline layers of various semiconductor materials. If desired, the layers can also have selected crystal polarities. Some embodiments of the provided methods are referred to herein by the trade name "Damascene-ELO™", because in these embodiments, the methods combine damascene techniques with epitaxial lateral overgrowth (ELO) techniques. However, this trade name should not be interpreted restrictively, because other preferred embodiments do not employ damascene techniques.

The provided low-defect-density, reduced crystal strain, monocrystalline semiconductor layers can be used for the fabrication of electronic, optic, or opto-electronic components or as templates for the growth of further low-defect-density, reduced strain, monocrystalline semiconductor layers, or the like. The template structures from which semiconductor layers have been detached can also be used again for the growth of further low-defect-density, monocrystalline semiconductor layers.

The present invention also provides both template structures for the epitaxial growth of low-defect-density, reduced strain, monocrystalline layers of various semiconductor materials and the low-defect-density, monocrystalline layers of various semiconductor materials that have been grown on (and optionally then detached from) the provided templates.

The invention has applications to epitaxially growing a wide range of semiconductor materials and combinations thereof, both elemental semiconductors and compound semiconductors. For example, it can be applied to combinations of Si (silicon) and/or Ge (germanium). It can also be applied to groups II-VI and groups III-V compound semiconductor materials. Particular applications are to growing pure or mixed nitrides of the group III metals (III nitrides) Al, Ga, and In, e.g., AlN, GaN, InN, AlGaN, GaInN, and especially to growing low-defect-density, reduced strain, monocrystalline GaN layers. In the following, the terms "semiconductor" and "semiconductor material" without modification are used to refer to materials to which this invention can be applied, and not to all semiconducting materials.

However, for conciseness and convenience of the following description and without intended limitation, the invention is described herein primarily in embodiments directed to growing III nitrides, and particularly in embodiments directed to growing GaN. This descriptive focus is only for example, and it should not be taken as limiting the invention. In fact, as will be apparent from the subsequent description and appended figures, the methods of this invention can readily be applied to growing group III-V compound semiconductors generally, to growing compound semiconductors belonging to other groups (e.g., group II-VI), to growing elemental and alloy semiconductors. Therefore, it is without limitation that the description herein focuses primarily on embodiments of the invention directed to III nitrides and to GaN.

Briefly, the methods of the invention, contrary to known ELO methods, provide or prepare a template structure with a plurality of GaN islands having carefully controlled characteristics, the template in certain embodiments including a mask layer covering undesirable portions of the islands and also regions of the template not already covered by the GaN islands. The exposed or upper portions of the islands preferably have a relatively low defect density, reduced lattice strain and the selected polarity. The intended GaN layer is then grown on this template structure by ELO techniques (i.e., growing conditions favoring lateral overgrowth) beginning on the exposed or upper portions of GaN islands. The intended layer therefore, like the islands, has a relatively low defect density, reduced lattice strain and the selected polarity.

Some embodiments deposit and rely on masking materials, while other embodiments do not deposit or rely on such materials. In embodiments referred to herein as certain Damascene-ELO™ embodiments, a masking material is deposited so that the Group III nitride islands and base substrate are covered, and then sufficient masking material is removed, e.g., by chemical-mechanical polishing, so that only the upper portions of at least some of the islands emerge through the remaining masking material. In further embodiments, a masking material is deposited to cover only a portion of the base substrate and the group III nitride islands whilst leaving the upper portion of the island structures exposed as a seed for subsequent ELO growth. In still further embodiments, masking material is not deposited, and instead, growth conditions are selected (e.g., ELO conditions) so that a continuous layer grows from the upper portions of the exposed group III nitride islands.

In more detail, preferred embodiments of the invention provide methods for fabricating layers including a semiconductor material and also layers including a semiconductor material fabricated according to the provided methods.

Preferred methods of the invention for fabricating layers including a semiconductor material, first, provide a template structure with a plurality of islands, the islands having a substantially irregular spatial arrangement, having upper portions with one or more selected crystal properties, and comprising a material on which the semiconductor material preferentially nucleates and grows, and second, grow the semiconductor material on the template structure under conditions selected to favor nucleation on the islands, then epitaxial lateral overgrowth (ELO) laterally beyond the islands, and then coalescence to form a substantially continuous final semiconductor layer that inherits one or more of the selected properties.

Preferably, the islands have a spatial density so that the final layer is substantially monocrystalline. Also, the material of the islands can include the semiconductor material of the final layer. The semiconductor material can include an elemental semiconductor material, or an alloy semiconductor material, or a Group II-VI compound semiconductor material, or a Group III-V compound semiconductor material. The selected crystal properties can include one or more of a low density of crystal defects, a selected crystal polarity, and a reduced crystal strain.

Preferred methods of the invention can further detach a portion of the final semiconductor layer, e.g., by forming a zone of weakness within the final semiconductor layer; and then applying energy to detach a portion of the final semiconductor layer at the zone of weakness. The detached layer can have substantially a single crystal polarity and/or can be substantially monocrystalline.

Preferred methods of the invention further fabricate layers where the semiconductor material includes a group-III-nitride (the layer material). In these preferred methods, a template structure is provided starting from a base substrate having a surface promoting nucleation of a further group-III-nitride material (the island material) by growing islands on the base substrate comprising the island material (under conditions selected) so that the resulting islands have a substantially irregular spatial arrangement and have upper portions with one or more selected crystal properties. The layer material is then grown on the template structure under conditions selected to favor nucleation on the islands, then epitaxial lateral overgrowth (ELO) laterally beyond the islands, and then coalescence to form a substantially continuous final semiconductor layer that inherits one or more of the selected properties.

The layer material and the island material can be the same material or different materials; the layer material can include aluminum nitride, or gallium nitride, or indium nitride, or a mixture thereof. When the layer material includes GaN, the selected crystal properties can be one or more of a surface density of defects or dislocations of approximately $10^8/cm^2$ or less, a percentage of relaxation in the lattice strain of at least 5%, and a crystal polarity selected to be one of +c (Ga-face) or a −c (N-face) orientation.

Preferred methods further preferably grow the island material under conditions selected so that a plurality of the dislocations arising in the resulting islands at the base substrate bend laterally and terminate at the lateral facets of the islands; and/or under conditions selected so that the resulting islands have lateral facets presenting crystal orientations that discourage nucleation and growth of the layer material and upper surfaces presenting crystal orientations that encourage nucleation and growth of the layer material.

Preferred methods further grow the layer material under conditions selected to first favor more vertical growth from the upper portions of the islands and subsequently more lateral growth from the initially-grown layer material; and/or under conditions selected to favor, after coalescence of the layer material, more vertical growth until a selected thickness of the final layer is reached; and/or under conditions selected to favor formation of a plurality of voided regions in the final layer located between the former islands. In the latter alternative, the methods can further apply energy in order to detach a portion of the final layer at the voided regions.

Preferred methods of the invention for fabricating layers including a group III nitride semiconductor material can deposit a masking material on a suitable template structure so that the upper portions of a majority of the islands are exposed through the masking material, and then, grow the semiconductor material on the template structure under selected conditions. The masking material preferably is selected so that the semiconductor material preferentially nucleates and grows on islands in comparison to on the masking material, and in particular. In particular, silicon nitride, or silicon oxide, or mixtures thereof are preferred masking materials.

As in other preferred embodiments, suitable template structures preferably have a plurality of islands in a substantially irregular spatial arrangement, with upper portions with one or more selected crystal properties, and comprising a material on which the semiconductor material preferentially nucleates and grows; and the selected conditions preferably, first, favor nucleation on the islands, then epitaxial lateral overgrowth (ELO) laterally beyond the islands, and finally, coalescence to form a substantially continuous final semiconductor layer that inherits one or more of the selected properties.

In preferred versions of these methods, the masking material is deposited until selected conditions are met. In one preferred version, the masking material can be deposited until at least a majority of the side facets of the islands and of the portions of the substrate not covered by the islands are covered by the masking material, while the upper portions of at least a majority of the islands remain exposed.

In another preferred version of these methods, the masking material can be deposited until the islands and the portions of the substrate not covered by the islands are substantially covered by masking material. In this latter version, preferred methods remove excess masking material so that the upper portions of at least a majority of the islands are again exposed. The masking material can be at least partially removed by comprises chemical-mechanical polishing, after which surface smoothing of the upper portions of the islands can be performed The terms "low defect/dislocation densities" or "relatively fewer defects/dislocation densities", or the like, are used throughout and should be understood as relative to the state of the art for a particular semiconductor material. Different semiconductor materials have different physical properties and have been developed to different degrees in the art. Therefore, low defect or dislocation densities as understood in the art of one semiconductor material, e.g., of GaN, can be substantially different from the defect or dislocation densities as understood in the art of another semiconductor material, e.g., Si.

In the case of applications to GaN, low defect or dislocation densities are taken to refer to herein to defect or dislocation densities of less than approximately on the order of $10^8/cm^2$, preferably less than approximately on the order of $10^5/cm^2$ to $10^7/cm^2$, and more preferably less than approximately on the order of $10^5/cm^2$. Conversely, the terms "high defect/dislocation densities", or "relatively more defects/dislocation densities", or the like, are taken herein to mean a dislocation or defect density of greater than approximately on the order of $10^9/cm^2$. The defects or dislocations of interest are primarily those defects, especially threading dislocations (TD), that originate at the interface between the grown group III nitride and the substrate and that propagate into crystal as it is grown. The defect density in the group III nitrides is measured by methods well know to those familiar in the art, including, atomic force microscopy (AFM), scanning electron microscopy (SEM) and transmission electron microscopy (TEM). The preferred method for determining defect density is by TEM, therefore values for defect densities stated herein are assumed to have been determined by TEM.

In the case of applications to alloys of Ge and Si, e.g., $Si_{1-y}Ge_y$ where y>0.2, low defect or dislocation densities are taken to refer to herein to defect or dislocation densities of less than approximately on the order of to $10^4/cm^2$ to $10^5/cm^2$, preferably less than approximately on the order of $10^3/cm^2$ to $10^4/cm^2$, and more preferably less than approximately on the order of $10^3/cm^2$. Conversely, the terms "high defect/dislocation densities", or "relatively more defects/dislocation densities", or the like, are taken herein to mean a dislocation or defect density of greater than approximately on the order of $10^6/cm^2$.

And in the case of applications to Ge on Si low defect or dislocation densities are taken to refer to herein to defect or dislocation densities of less than approximately on the order of to $10^6/cm^2$ to $10^7/cm^2$, preferably less than approximately on the order of $10^5/cm^2$ to $10^6/cm^2$, and more preferably less than approximately on the order of $10^4/cm^2$. Conversely, the terms "high defect/dislocation densities", or "relatively more defects/dislocation densities", or the like, are taken herein to mean a dislocation or defect density of greater than approximately on the order of $10^8/cm^2$.

In the case of applications to III nitrides, the term "reduced levels of lattice strain" refers herein to a level of strain, for a given composition, that is less than the level of strain present at the critical thickness for the formation of crystal defects during hetero-epitaxial growth. To further explain, a limited amount of elastic strain can be accommodated by a material without generating dislocations or defects. This accommodation requires an amount of energy which is governed by the material thickness and size of the lattice mismatch. Energy is also required to create a defect in the material to relieve the lattice strain. If the strain is greater than this energy dislocations or defects can form. Therefore, if the strain in the epitaxial layer can be kept at a level small enough so that the elastic energy remains below the energy of defect formation, the strained layer will be thermodynamically stable against dislocation formation. This is called pseudomorphic growth since the growing epilayer maintains the lattice parameters of the underlying substrate. However, for a given material composition, strain increases with thickness of deposited material until a "critical thickness" is reached, at which thickness strain in the epitaxial layer is sufficient to cause defect formation, which reduces lattice strain.

Therefore, the term "reduced levels of strain" can also refer to a crystal where strain has been accommodated by relaxation of the structure to such an extent that the crystal lattice strain (tensile/compressive) is relaxed (below the threshold for dislocation of defect formation). The relaxation of the crystal strain can be quantified by considering the percentage stain relaxation (R), $$R=(A-A_S)/(A_1-A_S)\times 100\%$$

where A is the measured in-plane lattice parameter of the strained layer, $A_1$ is the unstrained in-plane lattice parameter for the strained layer and As is the in-plane lattice parameter for the substrate. For a fully relaxed material, i.e., one where the lattice parameters of the material have relaxed to their unstrained values ($a=a_1$), R is 1 (or 100%). For a material that has not under gone any strain relaxation, i.e., one where the lattice parameters of the material remain equal to those of the substrate ($a=a_s$), such as a material prior to reaching the critical thickness for defect formation, R=0 (or 0%).

The term "substantially" is used herein to refer to a result that is complete except for the deficiencies normally expected in the art. For example, a pattern is "substantially random" if it does not appear to have any regular pattern upon visual inspection. A "substantially random" pattern need not be random in an exact mathematical sense. Also, an epitaxial layer cannot routinely be expected to be completely continuous (or completely monocrystalline, or completely of one crystal polarity) across macroscopic dimensions. However, an epitaxial layer can routinely be expected to be "substantially continuous" (or "substantially monocrystalline", or "substantially of one crystal polarity") across macroscopic dimensions where the discontinuities (or crystal domains, or crystal boundaries) present are those expected in the art for the processing conditions, the material quality sought, or so forth.

Headings are used herein for clarity only and without any intended limitation. A number of references are cited herein, the entire disclosures of which are incorporated herein, in their entirety, by reference for all purposes. Further, none of the cited references, regardless of how characterized above, is admitted as prior to the invention of the subject matter claimed herein. Further aspects and details and alternate combinations of the elements of this invention will be apparent from the following detailed description and are also within the scope of the inventor's invention.

BRIEF DESCRIPTION OF THE DRAWINGS

The present invention may be understood more fully by reference to the following detailed description of the preferred embodiment of the present invention, illustrative examples of specific embodiments of the invention and the appended figures in which.

DETAIL DESCRIPTION OF THE PREFERRED EMBODIMENTS

By way of brief introduction, differences between embodiments of the present invention and known methods (illustrated in FIG. 2) are first highlighted. Then, preferred embodiments of the invention are described with reference to FIGS. 3, and 4A-4D. Further preferred embodiments are described with reference to FIGS. 5A-D and 6A-C. Finally, examples are described with reference to FIGS. 7 and 8.

Figure 1:
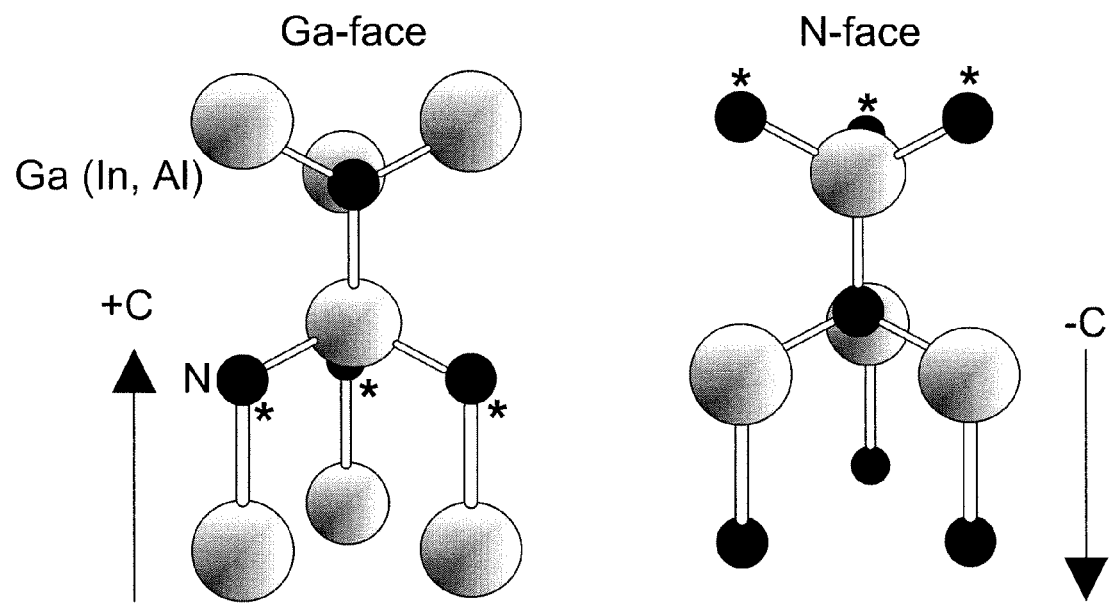
FIG. 1 illustrates polarity in III nitrides.
Figure 2:
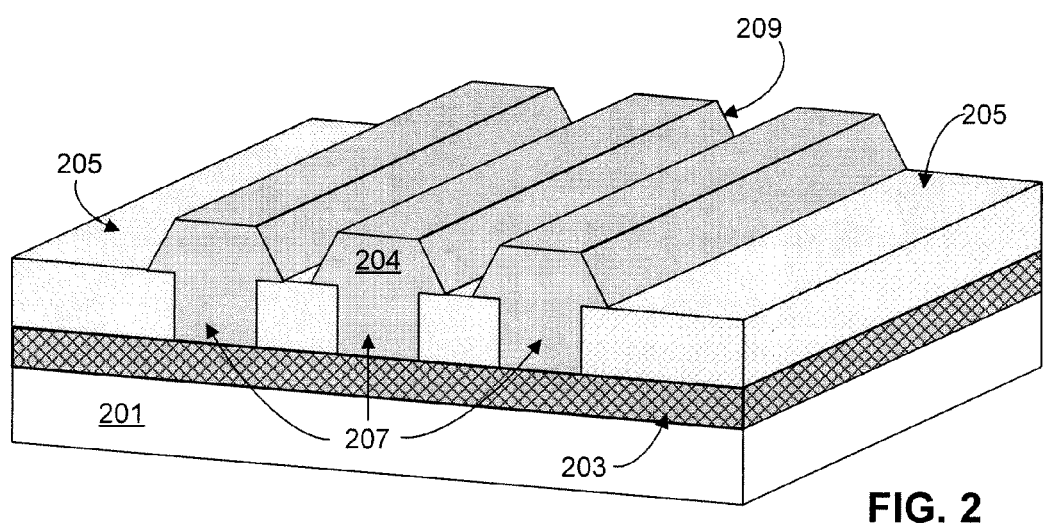
FIG. 2 illustrates an exemplary prior art process.

Turning now to the prior art, in many known methods for growing GaN layers, a template is covered with a mask patterned using standard photolithographic processes, and the GaN is then grown through openings in the patterned mask. FIG. 2 illustrates substrate 201 with template 203 that is partially covered by regularly patterned mask 205 with regularly arranged mask openings 207. Regularly patterned masks are usually prepared using standard photolithography. Next, GaN is then grown on the masked substrate, so that it first nucleates on portions of the surface of template 203 that are exposed through mask openings 207 (instead of on the mask), and then grows vertically through the mask openings. In the final stages of growth, the GaN extends laterally 209 over the mask. If the substrate and mask materials are properly selected and if the mask openings are properly spaced apart, after a time, the laterally growing GaN 209 will eventually coalesce to from a monocrystalline layer of GaN.

In contrast, processes of the invention have one or more significant differences from such prior art. A first difference is that, instead of forming a regularly patterned photolithographic mask through which GaN grows in a regularly patterned arrangement, methods of this invention form an irregular pattern of separated GaN (or other III-V or semiconductor material) islands on a base substrate (islands 7 on substrate 3 in FIG. 4C) without any photolithographic mask. Irregularly-arranged, separated semiconductor islands can be formed in at least two distinct manners: epitaxial growth under selected conditions on a prepared surface (e.g., a nucleation layer) of a substrate; or etching of a 2D substantially continuous III nitride layer having irregularly-arranged regions with distinctly different etch resistances. The final continuous semiconductor layer is then grown preferentially from the upper portions of these irregularly-arranged islands. Thus, while prior art grows a final GaN from regularly arranged GaN templates using photolithographic masks; the invention, in contrast, grows from irregularly-arranged semiconductor templates without any such mask.

In certain embodiments, a second difference is that, after formation of the irregularly-arranged islands but before growth of the final continuous semiconductor (e.g., GaN or other material to which this invention can be applied) layer, masking material is formed so as to cover the substrate surface while leaving the upper portions of the irregularly-arranged semiconductor islands exposed. The masking material is chosen so that growth of the final layer preferentially begins from the exposed upper portions of the islands and not from the masking material. In some embodiments, excess masking material can be formed by deposition so as to bury the irregularly-arranged semiconductor islands followed by removal of excess masking material sufficient to expose the upper portions of the islands (masking material 17 in FIGS. 4C and 4D). In other embodiments, masking material is deposited just sufficiently so that the substrate and lateral facets of the irregularly-arranged semiconductor are masked. Thus, while prior art first forms a patterned mask and then grows regularly-arranged GaN through the patterned mask; certain embodiments of the invention, in contrast, first provide a template having irregularly-arranged semiconductor islands and then deposit or place masking material around the irregularly-arranged islands.

Figure 3:
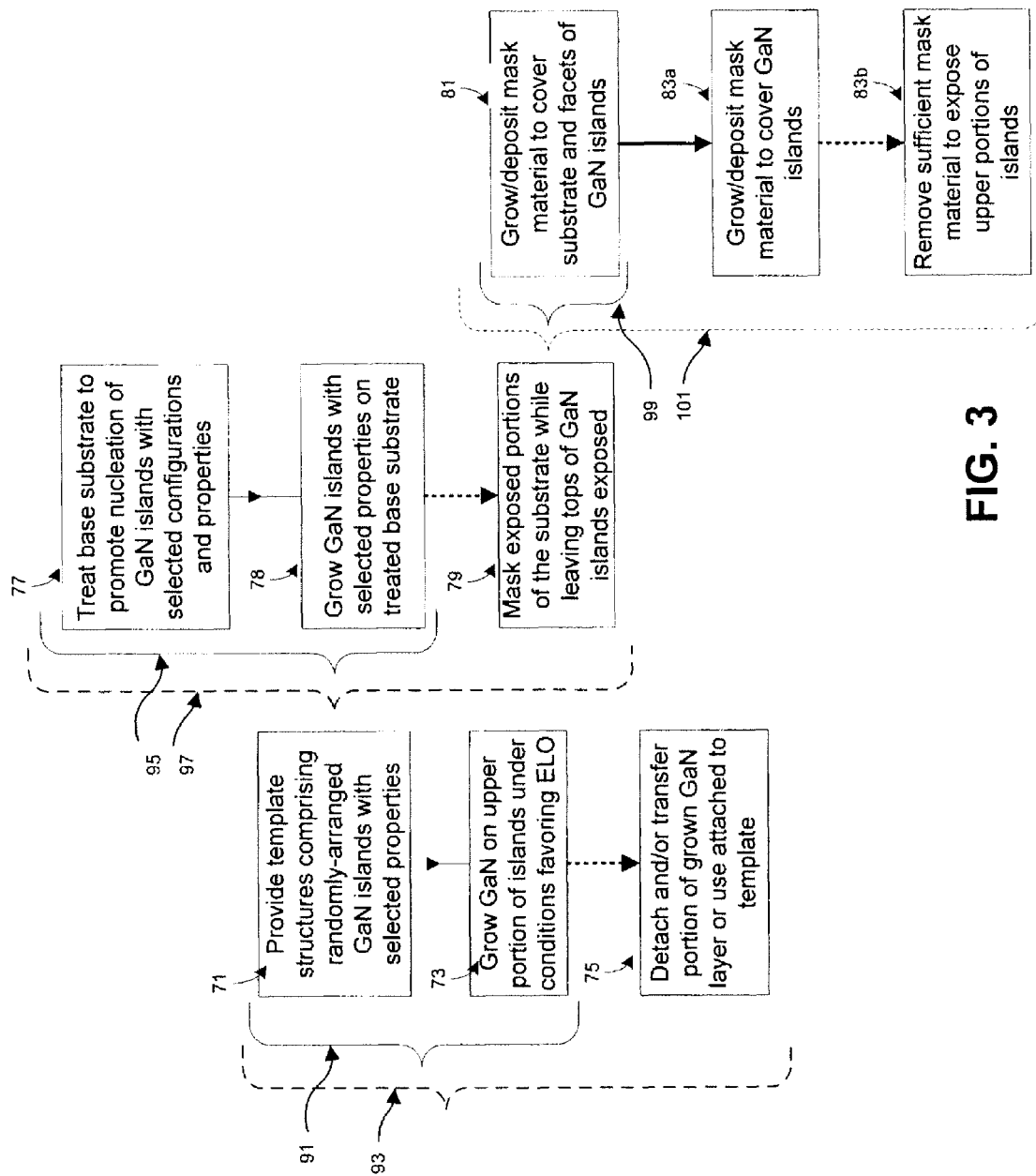
FIG. 3 illustrates preferred embodiments of the invention.

FIG. 3 now illustrates various embodiments of the invention, which, for descriptive purposes and as an aid to appreciation of the invention, are arranged into a three-level hierarchy in which each level provides an embodiment or elaboration or implementation of portions of its previous level, and the lowest level presents the invention as a whole. In FIG. 3, the steps of a particular level of the hierarchy are arranged in a vertical column, and elaborate or implement the step (of the previous level) pointed to by the enclosing left brace or braces. The multiple left braces at each level indicate alternative embodiments of that level.

Accordingly, from FIG. 3, all preferred embodiments (91), of the invention as a whole, provide (71) template structures comprising randomly-arranged GaN (or other III nitride or similar material) islands with selected properties, e.g., low defect density, reduced lattice strain, selected crystal polarity, and the like, and then grow (73) a final GaN layer from the upper portions of the islands under conditions generally favoring ELO. Preferred semiconductor materials for the islands encourage nucleation of the semiconductor of the final layer. Specific ELO conditions are described subsequently, but in general are preferably chosen primarily according to whether or not a mask material has been deposited or placed on the substrate around the randomly arranged islands. Growth is complete when a suitable and substantially continuous final layer has been formed. The materials of the semiconductor islands and of the final semiconductor layer can be the same or different.

The final layer can be used for applications while still attached to the template, or in alternative embodiments (93), can be detached and/or transferred (75) prior to use. Uses include serving as substrates for electronic, optic components, or the like, or as substrates for growth of further GaN layers having the selected crystal properties.

Further preferred embodiments (95, 97) provide various embodiments or elaborations or implementations of step 71 of providing a template. Preferred embodiments (95) provide templates, first, by treating (77) a base substrate so that its surface will promote nucleation of semiconductor islands at a selected spatial density and with selected properties (a nucleation treatment), and second, by growing (78) semiconductor islands with selected properties on a treated base substrate. Generally, spatial densities are selected so that the final semiconductor layer grown under ELO conditions will, after coalescence, be sufficiently monocrystalline. Since there is no patterned template or the like, the semiconductor islands will generally grow in an irregular or random pattern. Certain preferred embodiments (95) use such templates without further processing for growth 73 of a final layer. Other preferred embodiments (97, 99, and 101), before growth of a final layer, further process the template by depositing (79) a masking material such that the upper portions of the semiconductor island are exposed.

In other embodiments of step 71, instead of growing separate semiconductor islands, a relatively thick, continuous semiconductor (e.g., GaN or other III nitride) layer can be grown on the nucleation layer so as to have significantly varying etch resistance from region to region. The relatively thick, continuous semiconductor is then subjected to an etchant (preferably chosen according to the semiconductor material) so that the disparity in etch rates leads to formation of isolated island regions, e.g., in those regions where the relatively thick GaN layer had increased etch resistance.

In other embodiments of step 71, the template structures can be optimized to promote final semiconductor (e.g., a III nitride) growth in configurations other than a layer, in particular, in nano-structures, such as, for example, nano-wires, nano-pillars and nano-dots. In such nano-structure embodiments, the exposed upper portions of the semiconductor islands can be tailored to a variety of dimensions, shapes, and area densities depending on the nano-scale application involved. For example, the islands can predominantly have a pillar-like shape and nano-scale dimensions. Nano-scale III nitride or other semiconductor materials are advantageous because of reduced defect density and the presence of new quantum confinement effects. See, e.g., Nature Materials 1:106 (2002); U.S. Pat. No. 6,806,288. Although the majority of the following description concerns the layer-directed embodiments of this invention, this description should not be considered as limiting. It will be apparent that the methods described can also be applied to producing structures and especially templates for novel nano-devices.

In other embodiments of step 71, the base substrate can be pre-treated.

In more detail, Step 77 can perform a nucleation treatment that can form a separate layer of material (e.g., AlN in the case of GaN), or can modify the uppermost atomic layers already present on the base substrate (e.g., by increasing nitrogen content (nitrodization)), or can form catalytic regions (for example by depositing nano-dots of gallium, indium, nickel etc.) to promote the local growth of semiconductor. However processed, the treated base substrate is referred to herein as having a nucleation layer (NL).

In more detail, Step 78 preferably grows semiconductor islands under conditions so that the upper portions of the islands have lower densities of defects and dislocations than the lower portions. For example, growth conditions can be chosen so that defects and dislocations originating at the interface with the base substrate, for instance threading dislocations, are induced to bend laterally and terminate in the lateral facets of the islands. If necessary, the GaN (or other III nitride, or other semiconductor) islands are then subjected to a smoothing process to produce a uniform island height.

Finally, certain further preferred embodiments (99, 101) provide various embodiments or elaborations or implementations of step 97 of masking the template. Preferred masking materials discourage nucleation of the semiconductor material of the final layer, so that this layer preferentially nucleates on the exposed portions of the islands. A primary difference between embodiments 99 and 101 is the extent of coverage and depth of the masking material. Embodiment 99, step 81, grows, deposits, or places masking materials preferably on the portions of the base substrate not covered by the islands and on most or all of the lateral facets of the islands. Accordingly, the upper portions of the islands remain exposed. Embodiment 101 on the other hand continues to grow, deposit, or place 83a masking materials until the semiconductor islands are fully covered, and then removes sufficient mask material so that the upper portions of islands are again exposed. This embodiment is referred to as a "damascene ELO" or simply as a "damascene" embodiment.

Masking materials are used primarily to discourage nucleation and growth of the final layer from a substrate which has crystallographic properties not properly matched to the material of the final layer, and also to discourage nucleation and growth of the final layer from lateral facets of the semiconductor islands which present higher defect densities than do the upper portions of the islands. In embodiments which do not mask the semiconductor islands, e.g., embodiments 91 and 95, these effects are achieved by growing the islands so as to encourage lateral facets of the islands to present crystallographic planes from which growth is relatively slower, and to encourage upper portions of the islands to present crystallographic planes from which growth is relatively faster. Such embodiments are useful in the case of semiconductor materials comprising III nitride compounds, e.g., GaN.

Finally, the inventions includes the above methods and also includes structures grown by the above methods, e.g., templates, final layers attached to a template, final layers detached from a template, nano-structures, and so forth.

Turning now to a more detailed description of preferred embodiment 101 and with reference to FIGS. 4A-4D, FIG. 4A schematically illustrates a prepared template structure comprising base substrate 3 with selected nucleation and/or buffer layers 5 (referred to herein collectively as a nucleation layer ("NL")) and nucleation sites/nuclei 1, 1, and 1". Preferred base substrates 3 have physical properties, e.g., crystal lattices sizes and structures, coefficients of thermal expansion, and the like, that are similar to GaN (or other III nitrides), or that otherwise promote growth of high-quality GaN. Preferred base substrates can be non-composite (i.e., homogenous), or can be composite structures, where one component provides similar coefficients of thermal expansion and another component provides similar crystal lattice sizes and structures. For example, a composite substrate may consist of a sapphire-on-insulator-on-SiC (or AlN) structure, where the sapphire provides a reasonable lattice match, required to limit the formation of defects in the epitaxial layer, and the SiC (or AlN) provides a match in the coefficient of thermal expansion, preventing thick III nitrides from cracking upon cooling. Other composite substrates include, but are not limited to GaN-on-insulator (GaNOI), silicon-on-poly-silicon-carbide (SopSiC) and SiC on poly-crystalline SiC (SiCopSiC). Other possible non-composite substrates include sapphire, silicon carbide, silicon, silicon oxide, gallium arsenide, lithium gallate, lithium aluminate and the like, with sapphire being preferred.

Prior to describing NL 5, the use herein of the term "nucleation" is explained. Epitaxial growth (and crystal growth generally) usually begins with the spontaneous formation of minute crystallites which serve as seeds for the growth of macroscopic crystals. The minute crystallites are referred to herein as "nuclei" and the processes of their formation and initial growth are referred to as "nucleation". In the case of epitaxial growth which nucleates on surfaces, the properties of the surface can strongly influence the spatial configurations and crystal properties of the nuclei by, e.g., making certain configurations and properties more stable than other configurations and properties. The term nucleation layer refers to such surface properties whether achieved by deposition/growth of buffer layers, or by surface chemical treatments, or by other means.

Preferred nucleation layers promote GaN (or other III nitride) nucleation in nuclei with selected spatial density and configuration and with selected crystal properties. With respect to spatial density, these are selected in view of the subsequent application of ELO techniques. ELO is known in the art to produce substantially continuous and monocrystalline layers of GaN of better quality if there are a sufficient number of growth sites available on which ELO can be initiated, and if the available growth sites are spaced apart so that lateral overgrowth from different growth sites can coalesce into a monocrystalline layer with minimal grain boundaries. Generally, it is preferred that NL 5 promote nucleation in separate and isolated nuclei spaced apart on the average between 0.1-100 µm and more preferably between 0.2-3 µm, such as nucleation sites/nuclei 1, 1, and 1" in FIG. 4A.

Preferred crystal properties include lower defect or dislocation densities, reduced lattice strain, selected crystal polarity, or combinations thereof. With respect to defect or dislocation densities, many defects and dislocations originate at the interface between growing GaN (or other material) and the substrate because of mismatch in lattice structures, coefficients of thermal expansion, and the like. NL treatments, especially thin buffer layers, that are known to lower such interface-induced defects or dislocations, are useful in this invention even through they alone may not lead to low defect or dislocation densities (as this term is used herein). In the case of III nitrides, suitable thin buffer layers usually also comprise or consist of III nitrides. For example, a thin GaN layer grown at a lower temperature or an AlN buffer layer can be useful for growing GaN.

With respect to strain, various mechanisms are known to reduce lattice strain in semiconductor materials. However, reduction in lattice strain is generally accompanied by defect formation and/or compositional phase separation. For example, it is known that hetero-epitaxial growth on highly mismatched substrates (e.g. GaN on sapphire, InN on GaN, etc.) proceeds in a generally 3-D mode through the formation of a plurality of islands, instead of as a more-or-less uniform layer. Island formation is favored because strain energy (proportional to the substrate contact area of the GaN) can be greater than surface energy (proportional to the free surface area of the GaN). Island growth can minimize substrate contact area (as compared to layer growth), and thus minimize the total energy of the system. However, as growth of islands continue, strain energy will increase until the critical layer thickness is reached, at which point it becomes energetically favorable for formation of defects and dislocations which at least partially relax strain.

It is known that strain relaxation is usually initiated through the formation of misfit dislocations in the interface plane and threading dislocation in the growth directions (in addition to compositional phase separation). The misfit dislocations nucleate preferentially at the edges of island structures primarily in the vicinity of the island/substrate interface, see Strunk et al. (Physica Status Solidi (a) 171 1 p 215). For example Ng et al. (Applied Physics Letters 81 21 p 3960) examined the strain in InN grown on GaN, and found that under 3-D growth conditions the ≈10% lattice mismatch between the materials had been accommodated within the growth of 5 layers of InN material with a reduction in strain to 0%. Kim et al. (Applied Physics Letters 69 16 p 2358) investigated the relationship between strain and GaN material thickness deposited on a sapphire substrate. The estimated critical layer thickness for GaN on sapphire was about ≈30 Å with full relaxation of crystal lattice parameters to their strain free values after a deposition of ≈100 nm.

In this invention, growth parameters are additionally selected to promote threading dislocations to bend in the direction of the lateral faces of the III nitride islands. Therefore, threading dislocations are generally limited to the lower portions of the island structures, which are masked with a masking material. Also, the misfit between the substrate and the III nitride islands and the ensuing lattice strain can also be largely eliminated in the lower portions of the island structures. The onset of compositional phase separation in mixed nitride materials, for example InGaN, can be significantly reduced. Consequently, migration of lattice defects and dislocations from the upper portions of the islands (emerging through the masking material) into material epitaxially grown thereon is substantially prevented. Also, since the upper portions of the islands will have substantially reduced strain levels, material epitaxially grown thereon will have similarly reduced strain levels. Further, it possible to tailor the composition of the island structures to that of subsequent layers without the introduction of lattice mismatch effects from the substrate/nitride island interface.

Consequently, the present invention provides epitaxially grown material that is both substantially relaxed, but without any increase in defect density, and also has substantially reduced compositionally phase separation.

With respect to crystal polarity, various NL treatments are known to cause or encourage most nuclei to have a particular crystal polarity, and a particular NL treatment can be selected according to the polarity desired in a particular embodiment, which usually depends on the intended application of the layers to be grown on the template structure. Concerning GaN, it has been found advantageous to fabricate optic or electronic components in GaN layers presenting the +c polarity (Ga-face). Thus, if a layer is to be used in the orientation in which it was grown (the as-grown orientation), the preferred polarity is +c. However, if a layer is first detached from the template structure and then attached to a support substrate with an orientation opposite to the as-grown orientation (so that the exposed surface presents a polarity opposite to the as-grown polarity), the preferred polarity is −c (N-face). For other applications, the −c polarity may be preferred.

The ability to select between the two polarities of III nitrides is of major significance with regards to the ability to remove layers of III nitrides for layer transfer processes. The capability to select −c polarity (N-face) GaN films simplifies the transfer process, since only a single transfer to a donor wafer is required to achieve the +c (Ga-face) (preferable polarity for III nitride devices). In contrast, if the initial III nitride layer is grown +c polarity (Ga-face) then a thick epitaxial layer would be required which could then, in turn, be removed from the non-native substrate. The thick +c (Ga-face) would be more costly due to long growth times and poor wafer throughput. In addition, the backside of the free standing layer would have more defects due to proximity to the substrate/III nitride interface.

Numerous NL treatments, e.g., leading to NL 5 on base substrate 3, and their effects have been described and are known in the art and can be usefully utilized in this invention. See, e.g., Sumiya et al., 2004, *Review of polarity determination and control of GaN*, MRS Internet J. Nitride Semicond. Res. 9, 1; Gibart, 2004, *Metal organic vapor phase epitaxy of GaN and lateral overgrowth*, Rep. Prog. Phys. 67, 1; Dwikusuma et al., 2003, *X-ray photoelectron spectroscopic study of sapphire nitridation for GaN growth by hydride vapor phase epitaxy: Nitridation mechanism*, J of Appl. Phys. 94, 5656; Narayanan et al., 2002, *Gallium nitride epitaxy on (0001) sapphire*, Phil. Mag. A 82, 885, Stutzmann, et al., 2001, *Playing with Polarity*, phys. stat. sol. (b) 228, 505; Oh et al., 2006, *Optical properties of GaN and GaMnN nanowires grown on sapphire substrates* and Kikuchi et al., 2004, *InGaN/GaN Multiple Quantum Disk Nanocolumn Light-Emitting Diodes Grown on (111) Si Substrate*. Described herein are certain selected treatments.

NL treatments can comprise deposition/growth of one or more, usually thin (e.g., 10 nm or less) layers of a heterogeneous material or materials known as buffer layers. Buffer layers useful for growing GaN include 10 Å-10 μm thick layers of AlN or GaN that have been grown at temperatures (e.g., approximately 500-700° C.) lower than the GaN growth temperature. NL treatments can also comprise chemical treatment, or thermal treatment, or the like, of the surface of base substrate 3 which generally structurally or chemically alter the uppermost portions of substrate 3. Chemical modifications include nitridizing oxide-based substrates (e.g., sapphire or spinel) by brief exposure to $NH_3$, increasing the Si fraction of Si-based substrates (e.g., SiC or $SiO_2$) by brief exposure to a silicon-containing gas, and so forth. Thermal treatments include brief annealing by exposure to higher temperatures up to approximately 1000-1200° C. These treatments can be applied individually or in combination.

Also, it is known that the specific effects of a particular NL treatment can depend on the epitaxial process used and on the precise conditions during that process, and NL treatments must be selected accordingly. Vapor phase epitaxy (VPE) processes are preferred, including MBE (molecular beam epitaxy), or HVPE (halide/hydride vapor phase epitaxy), or MOCVD (metal-organic chemical vapor deposition).

More specifically in the case of GaN, the following NL treatments are known to affect spatial density and configuration of nucleation sites and nuclei. Further, it is known that many treatments that control polarity also affect nucleation configurations, and vice versa. Materials that appear to be Ga or N surface active with respect to GaN, can affect nucleation density, configuration, and mode. For example, silicon, which is believed to act as a "surfactant" for GaN, present in the uppermost surface layers of a sapphire substrate can reduce density of subsequent GaN nucleation sites or nuclei. Similarly, a thin layer of silicon carbide or silicon oxide can similarly reduce density of subsequent GaN nucleation sites or nuclei. It is believed that GaN does not readily "wet" these materials. Further, because of a mutual affinity, a thin layer of AlN (or of GaN), especially if grown at lower temperatures (e.g., 500-700° C.) promotes dense nucleation sites and nuclei that readily merge into continuous layers. However, higher temperature (e.g., 1000-1100° C.) annealing of a thin (e.g., less than 10 nm) GaN buffer layer, especially in the presence of hydrogen, can lead to subsequent nucleation in separate and discrete nucleation sites and nuclei. Also, transient conditions at the beginning of epitaxial depositions, e.g., the presence of $NH_3$ prior to the presence of a Ga precursor, can alter a substrate surface and affect subsequent GaN nucleation and growth.

The following NL treatments are known to affect polarity. In MBE processes, it has been found that thinner GaN or AlN buffer layers and/or annealed GaN or AlN buffer layers promote −c orientation, while thicker GaN buffer layers and higher temperature AlN buffer layers promote +c orientation. In HVPE processes, it has been found that surface nitridation and thinner lower-temperature GaN buffer layer promotes promote the −c polarity, while exposure to gallium chloride, thicker lower-temperature GaN buffer layers, or AlN layers promote +c orientation. In MOCVD processes, it has been found that thinner GaN or AlN buffer layers, especially if annealed for shorter times, or surface nitridation promote the −c polarity, while thicker buffer AlN or GaN layers or surface hydrogen cleaning promote the +c polarity.

Finally, polarity of a GaN layer can be determined by methods known in the art. For example, it can be determined by differential etch rates, e.g., +c polarity faces (Ga faces) are relatively resistant to etching in, e.g., a KOH/$H_2$O solution, while −c polarity faces (N faces) are easily etched. Non-destructively, polarity can be determined by coaxial impact collision ion scattering spectroscopy (CAICISS). Polarity can be determined by coaxial impact collision ion scattering spectroscopy or by other methods known in the art, e.g., x-ray photoelectron spectroscopy, surface reconstruction, and chemical stability.

In summary, for growing GaN on sapphire, it is preferable for +c polarity that an NL treatment leads to a thicker AlN (or GaN or generally a metal nitride) surface layer. For −c polarity, it is preferable that the sapphire surface be oxygen (O) terminated, as are, e.g., commercial "epi-ready" sapphire substrates. In particular, for growing +c polarity GaN on sapphire, an advantageous NL treatment growth of a separate, heterogeneous, thicker AlN (or GaN) buffer layer at lower temperatures which is then annealed at higher temperatures. And for growing −c polarity GaN on sapphire, an advantageous NL treatment includes surface nitridation without formation of a heterogeneous AlN layer, as by, e.g., brief exposure to $NH_3$ at higher temperatures.

Figure 4A:
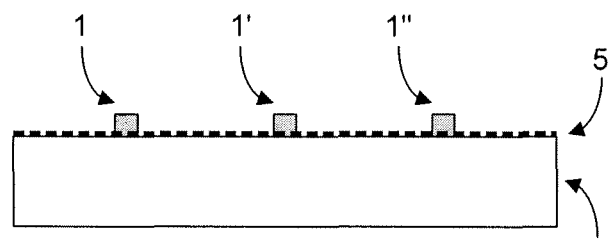
FIGS. 4A-F illustrate steps of a preferred embodiment of the invention.

Having a base substrate with a preferred NL selected as described above, whether commercially obtained or treated in a first process step, the methods of the invention next grow on the base substrate GaN islands. First, nucleation conditions are selected, if necessary in view of the NL, so that GaN (or other III nitride) initially grows at nuclei which have the spatial density and configuration described above. Generally, the density and configuration of nuclei is such that a subsequent ELO produces the intended GaN layers (having low defect or dislocation density and/or selected polarity). For example, FIG. 4A illustrates nucleation sites 1, 1', and 1" that are spaced apart determined on the average between 0.1-100 μm (more preferably between 0.2-3 μm) but are otherwise randomly arranged.

Figure 4B:
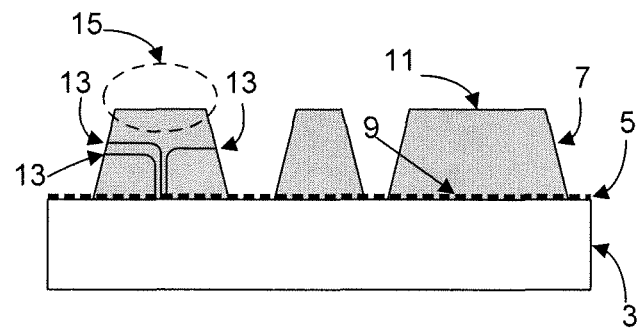

Growth conditions are selected, on average, to favor the growth of III nitride islands originating from the nuclei of the NL with the islands remaining on the whole separated from one another. FIG. 4B illustrates preferred (but non limiting) structures to be assumed by initially-grown GaN on NL 5 on substrate 3. Example 1 presents an actual example corresponding to FIG. 4B. The initial islands have a trapezoidal-like structure 7 with flat upper surfaces 11. In the illustrated embodiment, the islands have grown into structures with horizontal dimensions approximately 1-2 times their vertical dimensions. In other embodiments, there can be relatively more vertical growth so that the islands largely appear as pillars with more of a vertical component. Then the vertical/lateral aspect ratio can be greater e.g., approximately 2, or approximately 4. The invention also includes embodiments with more pronounced lateral growth so that the vertical/lateral aspect ratio is less than 1, but still results, on average, in separated island growth.

Growing conditions, in particular, the duration of growth, are further selected so that the upper portions of the pillars/islands have progressively fewer defects or dislocations. The growing islands/pillars typically have a number of defects or dislocations 13, in particular, threading dislocations (TD), which originate at the interface 9 between the NL and the GaN and propagate into the growing GaN. However, it is known in the art that a proper combination or ratio of vertical and lateral growth rates encourages the propagating TDs to tend to bend laterally away from the vertical direction towards the lateral faces of the growing pillars, and once they reach a lateral face, to terminate. See, e.g., Datta et al., phys. Stats. Sol (c) 3, No. 6 1750-1753 (2006). Significantly, as the pillars/islands grow, it is apparent that fewer and fewer TDs originating at the NL interface 9 remain so that the upper portions of the pillar/islands have progressively fewer TDs.

Growth is continued until the upper portions have a selected density of defects or dislocations and a reduction in lattice strain. If the growth period is too short, many of the dislocations will be in the process of bending laterally and not yet terminated so that the tops of the islands will not be sufficiently defect-free. On the other hand, growth should not be so long that islands tend to merge and no longer remain separate and isolated. Typically, growth to a vertical height of approximately 60 nm-1.5 μm is suitable. The density of defects and dislocations in the upper parts of the pillars/islands is preferably selected so that the GaN (or other III nitride) layer subsequently grown on the pillars has a suitably low density of defects and dislocations and subsequently a reduction in crystal strain. In preferred embodiments, the islands/pillars are grown until their upper portions have low densities of defects and dislocations, e.g., less than approximately $10^8/cm^2$ or less while, on average, remaining separate and isolated.

In the embodiment schematically illustrated in FIG. 4B, the left hand island has been grown under such preferred conditions so that dislocations 13 have bent laterally and terminated at a lateral face. The upper portion 15 of the left hand islands has therefore become relatively free of defects and dislocations and has the selected density of defects and dislocations. Also, the left hand island 15 has reduced strain, since the generation of the defects in the lower portions of the islands will have alleviated strain introduced due lattice mismatch between the substrate and the nitride material grown thereon.

In some embodiments, there are a single set of initial growing conditions which promote the proper combination of lateral and vertical growing rates so that defects and dislocation bend and terminate as illustrated in the left-hand island of FIG. 4B. In other embodiments, different conditions, one or more favoring vertical growth and one or more favoring lateral growth, can be alternated in order to achieve a proper combination of growth rates. Such variation of growth conditions is advantageous in embodiment 95.

Conditions favoring either vertical or lateral growth are known and described in the art for the common VPE processes, e.g., the MBE, MOCVD, or HVPE processes. See, e.g., U.S. Pat. No. 6,325,850; see also phys. Stats. Sol (c) 3, No. 6 1750-1753 (2006). Generally, the relative rates of lateral versus vertical growth are known to be influenced by growing temperature, V/III precursor ratio in the process gases, composition of the carrier gas ($H_2$ or $N_2$, or a combination thereof), and reactor pressure. For example, lateral growth is enhanced by higher growing temperatures, or by an increased V/III ratio, or by a greater $N_2/H_2$ ratio, or by lower pressures (less than or about 1 atm.), or by a combination thereof. Vertical growth is enhanced by the converse conditions. In particular embodiments, it can be advantageous to select details of NL treatment and of growing conditions in view of the dislocation structure and polarity of the resulting GaN islands. To this end, dislocation densities and other crystal properties of the initial GaN islands can be measured by means known in the art, e.g., light microscopy, transmission and/or scanning electron microscopy, and electron and/or x-ray diffraction.

In summary, the initial steps of this embodiment, schematically illustrated in FIGS. 4A-B, first treat or prepare a base substrate (or an already-treated substrate is provided) to comprise a preferred surface layer with preferred nucleation characteristics, namely, of promoting nucleation at sites with an average separation or density so that only limited or minimal lateral coalescence occurs during initial growth. Second, GaN (or other III nitride) is grown under conditions favoring a combination of vertical and lateral growth rates and for a growth time so that the islands do not coalesce but remain, on average, isolated from one another and also have uppermost portions that are relatively free of defects or dislocations. It is also preferred that the uppermost portions be faceted in a manner to promote subsequent ELO (in particular, lateral growth from the facets). A single growing condition or multiple growing conditions can be used.

After growing the GaN (or other III nitride) islands/pillars with upper portions having low defect densities, reduced levels of strain and with selected polarity (if desired in an embodiment), subsequent steps of this embodiment cover the exposed portions of the substrate not covered by the islands with a masking material. The mask has a thickness (or depth) sufficient to cover most or all of the lower portions of the islands having lateral faces with relatively larger numbers of terminating defects and dislocations, but not to cover the upper portions of the islands where the faces have only a relatively smaller number of terminating defects and dislocations. Also, upper portions of the islands/pillars that emerge through the mask preferably have sloping facets sufficient to promote subsequent ELO growth starting on the emergent upper portions of the islands/pillars and then extending across the mask. Preferred masking materials are those on which GaN does not readily nucleate. Such materials include silicon oxides, silicon nitrides, combinations thereof, e.g., silicon oxy-nitride, and other refractory silicon-containing materials. Silicon nitrides are particularly preferred because they are more easily removed by CMP than is GaN.

Figure 4C:
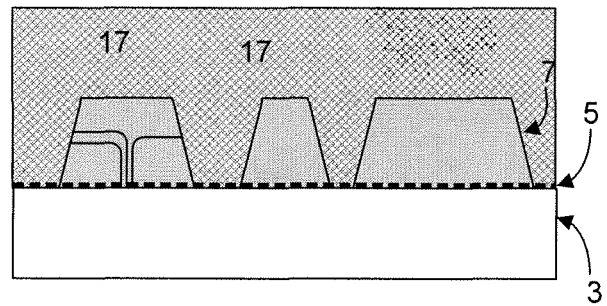
Figure 4D:
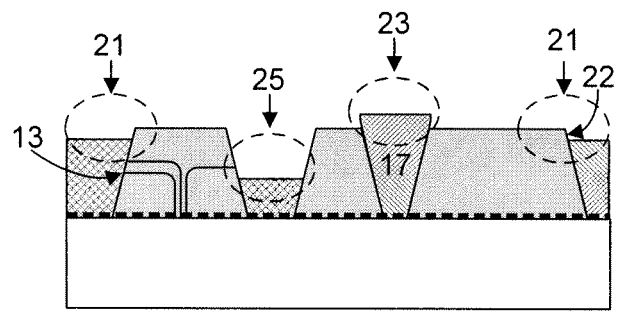

FIG. 4D illustrates an exemplary mask having different thicknesses in different regions. In region 21, the mask has a thickness in a preferred thickness range, because it covers those portions of the island's lateral faces, e.g., the lower portions, having relatively more terminating dislocations and defects while leaving exposed or emergent the upper portions of the island's (or pillar's) faces having relatively fewer terminating dislocations and defects and reduced strain. The mask also covers those lower portions of the island bodies having relatively greater strain and more internal defects, while leaving exposed those upper portions having relatively less strain and fewer dislocations and defects and a reduced degree of strain. For example, relatively defect free portion 22 of a lateral island/pillar face remains exposed. As is also preferred, the mask leaves exposed the emergent upper portions of the pillar faces having facets of various orientations, some more vertical and some more horizontal. Generally, a preferred thickness range for the height of the mask is approximately 60-80% of the height of the islands.

On the other hand, in regions 23 and 25 the mask thickness is not suitable or preferred. The mask in region 23 is too thick; it exposes or leaves emergent only a small portion of the tops of the islands. Further, none of the vertically-oriented facets of the upper portion are exposed or emergent; also portions of the sloping facets are covered. Such a mask depth can hinder subsequent lateral overgrowth of GaN from starting on the small, emergent upper portions of the islands/pillars. The mask in region 25 is too thin. It leaves exposed lower portions of the pillar faces having present relatively more defects and dislocations 13. As a result, GaN laterally growing from these exposed lower portions can inherit relatively greater densities of defects and dislocations.

In damascene-like embodiments, e.g., embodiment 99, masks are grown by a CVD process under real time monitoring control so that growth can be halted when the mask has reached a preferred thickness range. For example, during growing, the substrate can be scanned by type of radiation capable of detecting surface features, e.g., size of surface irregularities, that provide feedback concerning the height of the GaN pillars that remain emergent above the thickening mask. Such radiation can be visible, IR or UV light, or particles (as in SEM).

Preferred damascene-like masking methods first deposit masking material to fully cover the islands/trapezoids and then remove sufficient masking material so that the uppermost portions of the islands/trapezoids emerge through the mask. Accordingly, a masking material is first deposited/grown, e.g., by a CVD process, so that the islands (or pillars) are fully covered as illustrated in FIG. 4C. Here, island/pillar 7 (on NL 5 on substrate 3) have been completely covered by masking material 17. Second, a top portion of the masking material is removed or detached, e.g., by chemical-mechanical polishing (CMP) techniques, so that the final mask thickness is in a preferred range to promote subsequent epitaxial lateral overgrowth. FIG. 4D illustrates substrate 3 after partial removal of masking material 17. A preferred amount of masking material has been removed at region 21 so that the mask layer has a thickness in the preferred range. However, at regions 25 and 23, too much or too little, respectively, mask material has been removed so that the mask layer has thicknesses that are too thin or too thick, respectively.

Since little or no GaN should be removed along with the masking material, a preferred masking material also has characteristics that promote its more rapid removal as compared to the removal of GaN. For example, when masking material is to be removed by CMP, it should be more easily abraded/etched than is GaN (which is known to be relatively hard and resistant to removal by CMP).

In more detail, silicon nitride can be grown to fully cover the islands/pillars by a CVD process, e.g., from gaseous $SiH_4$ and $NH_3$ under conditions known in the art. Sufficient masking material is then removed by CMP using a suitably selected slurry, e.g., having selected abrasives and slurry chemistry, and using suitable polishing parameters, e.g., applied pressures and speeds. Briefly, slurry abrasives, polishing pressures, and the like are selected so that silicon nitride is removed primarily by mechanical action down to the top of the GaN pillars, which are left relatively unaffected. Slurry chemistry, pH, and the like are selected to promote the corrosion, dissolution, and dishing out of silicon nitride between the GaN pillars so that their uppermost portions are emergent through the remaining masking material. Optionally, masking material detachment can be monitored in real time so that CMP can be halted after a preferred thickness range has been reached. Also, a cleaning treatment can follow CMP in order to remove residual slurry.

In an ideal case the CMP process should result in little or no roughening of the surface of the GaN. However, if the abrasive action of the CMP process results in the abrasion of the GaN surface then the layer will require a post CMP smoothing process. In the case of III nitrides, the roughened surface can be smoothed by mass transport regrowth methods know in the art. In preferred embodiment the sample is heated in an $NH_3+H_2$ ambient to a temperature that promotes mass transport regrowth. During mass transport regrowth the high energy peaks in the material are redistributed into the valleys of the material resulting in a smoothing action and a surface more suitable for subsequent ELO. See, e.g., Japanese Journal of Applied Physics Part 1 40 565 (2001) and Applied Surface Sciences 159-160 421 (2000).

In addition, the largely separated GaN islands may require supplementary smoothing to produce a unified pillar height. The pillar height uniformity is of importance when considering subsequent processing requires the removal of masking material and the ability to stop mask removal once the III nitride material has been revealed. An uneven pillar height could result in inefficient mask removal and a non-ideal surface for the template structure. For III nitrides, the uneven surface can be smoothed by the mass transport regrowth methods described in the previous paragraph.

Next, GaN (or other III nitride) is grown under conditions favoring ELO starting from the emergent upper portions of the islands/pillars and then laterally over the masking material until a continuous layer of selected thickness is formed. Under ELO conditions, most GaN nucleation occurs on the emergent portions of the GaN islands and little of no nucleation occurs on the masking layer between the islands/pillars (and, of course, none on the masked NL of the support substrate). Since the GaN thereby grown can be expected to inherit properties of the material on which it nucleates, the resulting GaN layer, like the emergent portions of the islands, can be expected to have relatively few defects or dislocations. Also, if the islands/pillars have been grown to have a selected polarity, the resulting GaN layer can be expected to inherit the polarity presented by the tops of the islands. Consequently, the resulting GaN layer has relatively few defects or dislocations, a reduction in crystal strain and, if desired, has a selected polarity.

Figure 4E:
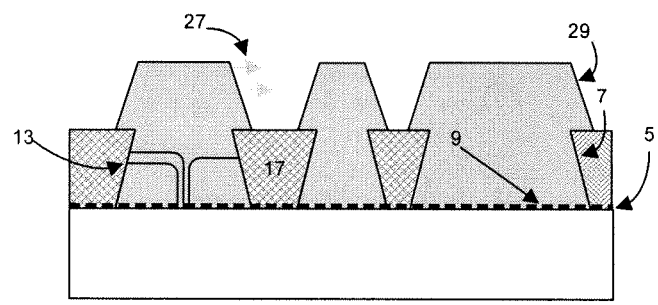

FIG. 4E illustrates an early stage of the further ELO of GaN on a preferred template structure. If the resulting GaN layer is to be less than approximately 1-5 μm thick, MOCVD is a preferred VPE process (its lower growth rates permit better control of thin layers). If the resulting GaN layer is to be more than approximately 5-10 μm thick, HVPE is a preferred VPE process (its higher growing rates reduce growing time).

Initial growth conditions are selected so that the extent of lateral growth 27 (i.e., growing parallel to the template structure) is favored over vertical growth (i.e., growing perpendicular to the template structure). GaN growth thereby largely starts on the facets 29 of the emergent upper portions of pillars/islands 7 and grows laterally over the masking material until it fuses into a continuous layer. The preferred spatial arrangement, spatial density, and structure of the emergent upper portions of the GaN islands/pillars is preferably such as to promote such an ELO process. For example, spatial density should be such that within approximately 5-30 min the laterally growing GaN fuses into a continuous layer with few or no crystal domain boundaries. The emergent upper portions are preferably randomly arranged so that the maximum inter pillar distances are not excessive. If this inter pillar distance is too great (the density is too low), fusion can require an excessive time (or perhaps not even be complete) and the continuous layer can have an excessive number of crystal domain boundaries. After fusion, growing conditions are selected to favor vertical growth and thickening of the GaN layers and epitaxial growth can be continued until the resulting GaN layer reaches a selected thickness.

Figure 4F:
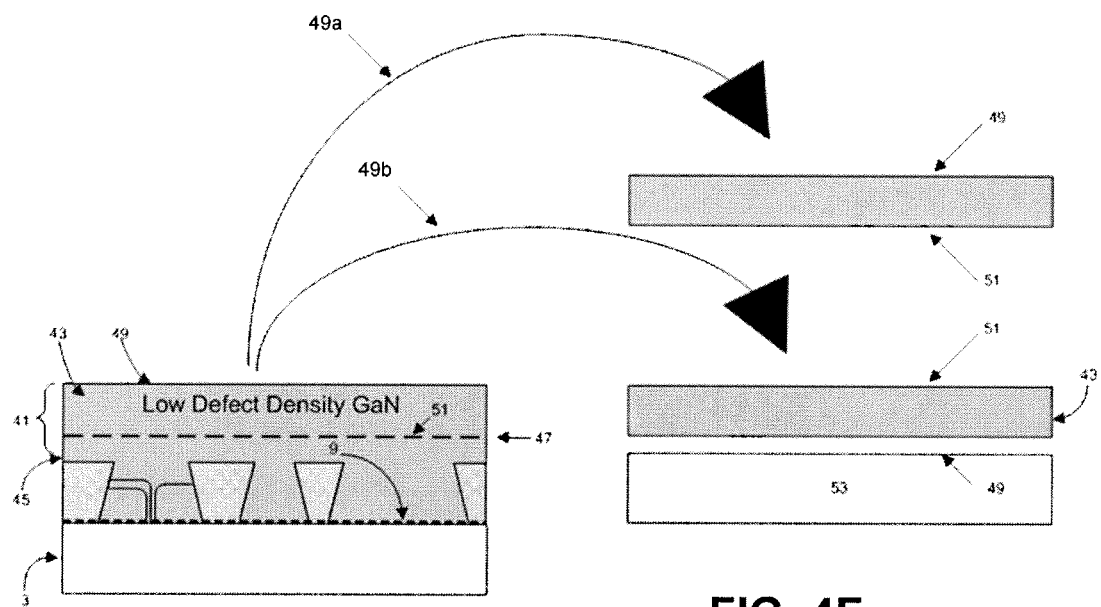

FIG. 4F (left portion) illustrates resulting GaN layer 41 which can have of a thickness of less than approximately 1 μm, or to approximately 100 μm, or to approximately 500 μm, or to approximately 1000 μm. The resulting GaN layer has relatively few defects or dislocations because most defects or dislocations 13 that propagated (from NL 5 on support substrate 3) into the GaN islands are hidden by the mask and cannot propagate further in the resulting GaN layer. Since little or no nucleation occurs on masking material 17, it does not originate further dislocations.

Resulting layer 41 is now available for use, such as for the fabrication of electronic components, optic components, or opto-electronic components, or as a substrate for further epitaxial growth. In embodiment 91, layer 41 can be used as-is, that is remaining attached to the template structure on which it is grown. In this case, layer 41 is oriented according to the selected polarity. In embodiment 93, top portion 43 of layer 41 can be detached for use, leaving layer 45 attached to the template structure. Detached layer 43 can be used in the as-grown orientation or in an orientation opposite to the as-grown orientation. When used in the as-grown orientation, the upper surface of the template structure remains upper surface 49 of the layer as used so that the layer retains the originally selected polarity. When used in an orientation opposite to the as-grown orientation, a buried surface adjacent to zone of weakness 47 becomes upper surface 51 of the layer as used. In this case, the as used polarity is opposite to the originally selected polarity.

FIG. 4F illustrates the options for the use of layer 43. According to use technique 49a, upper portion 43 is used directly so that the as-grown upper surface remains as-used upper surface 49. Since the as-used orientation is the same as as-grown orientation, the layer is used with the originally selected, as grown, polarity. Alternately in option 49b, layer 43 can be flipped before use to so that the as-used polarity is opposite to the as-grown polarity. Additionally, whether or not the layer is flipped before used, it can be bonded to support substrate 53 to form a composite structure. In this case, if support substrate 53 comprises an insulating surface layer, the resulting composite comprises "GaN on insulator" (also referred to as GaNOI) (or other III nitride on insulator). For example, support substrate 53 can comprise a Si wafer with a thin surface oxide layer. Also, the insulator can be provided on the GaN material before bonding to the support or to the surface layer of the support.

The template structure with remaining layer 45 can itself be used for component fabrication or as a high-quality template for further epitaxial growth of GaN. In the latter case, a newly grown layer can be detached and used and the support structure used as a template for growing additional layers.

A preferred layer transfer technique begins by forming a zone of weakness 47 at a selected depth (from surface 49), e.g., by implanting ions such as ions of H, $H_2$ or He. Zone of weakness 47 divides layer 41 into lower layer 45, which will remain attached to substrate 3, and into upper layer 43, which will be transferred from the template structure. Layer 43 can be freed from lower layer 45 by applying energy, e.g., elevated temperature or mechanical stress. This technique has the trade name of SmartCut®.

Figure 5A:
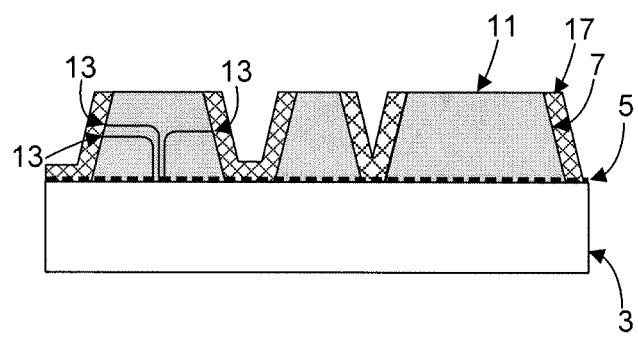
FIGS. 5A-D illustrate steps of an alternative preferred embodiment of the invention.

Embodiment 99 for producing the template structures is now described in conjunction with FIGS. 5A-D. In this embodiment the III nitride island structures are formed utilizing identical methods to those previously outlined (i.e. as shown in FIG. 4B) and therefore the methods are not repeated here. However, masking material 17 (as seen in FIG. 5A) in the methods of this embodiment only partially covers the III nitride island structures. A comparison of the difference with the methods of the previous embodiment is apparent upon comparison of FIGS. 5A and 4C.

Briefly, therefore the methods of embodiment 99 differ from those previous described in connection with embodiment 101 in that the masking material is deposited so as to partially (and not fully) cover the III nitride island structures. As a consequence of the partial mask coverage, a CMP step for removal of excess masking material is not required prior to ELO growth.

In further detail, a masking material 17 covers the majority of the side facets 7 of the island like structures in addition to the majority of base substrate 3 (FIG. 5A). However, upper surfaces of the island like structures 11 remain free, for the majority, of masking material. It should be noted that a small portion of masking material may be present on the upper surface of the island like structures but for the most part the majority of upper surfaces 11 are free of such masking material. Experimental evidence corroborates that a disproportionate amount of masking material covers the base substrate and side facets compared with the upper surface of the nitride island like structures.

As in previous embodiments the masking material preferable comprises a material which is capable of substantially preventing the nucleation of III nitride material and preferably comprises silicon nitrides, silicon oxides, or mixtures thereof. The masking material can be deposited either in-situ or ex-situ utilizing methods and chemistries previously described and is deposited to a thickness such that the majority of side facets 7 and the base substrate 3 are masked but upper surfaces 11 are substantially exposed. In preferred embodiments the masking material is deposited to a thickness less than approximately 100 Å, or less than approximately 50 Å or less than approximately 20 Å (or values between these limits).

Following the masking of portions of the base substrate and the side facets of III nitride island like structures, the template structure of FIG. 5A is utilized for subsequent ELO growth to form a continuous film of III nitride material. The upper exposed portions of the III nitride island like structures have preferred characteristics (e.g. composition, polarity, strain and defect density) and are utilized as the seed material for ELO growth. In contrast to the III nitride material, masking material 17 substantially prevents nucleation from the majority of side facets 7 and base substrate 3 and thus prevents the propagation of defects 13 into subsequent growth layers.

In greater detail, GaN (or other III nitride) is grown under conditions favoring ELO starting from the exposed upper portions of the islands/pillars. In certain embodiments the growth can be initiated from the island structure in a more vertical growth mode and upon obtaining a desired vertical height switched to a more lateral growth mode, alternatively a lateral growth mode can be utilized from the off set. In certain embodiments an initial vertical growth mode may be employed to provide III nitride side facets from which lateral growth can be initiated. In addition growth conditions can be selected to yield a growth mode incorporating both lateral and vertical components. Conditions suitable for obtaining vertical and lateral growth modes have been previously discussed and are well known in the art.

Figure 5B:
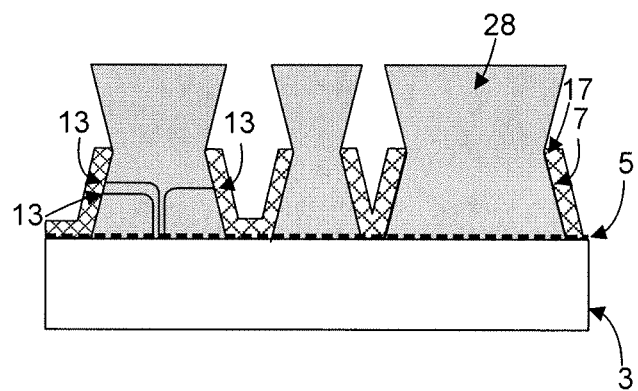

FIG. 5B therefore illustrates an early stage in the ELO growth from the exposed surfaces of the island structures. The additional III nitride material deposited during the ELO process 28 can be expected to inherit properties of the material on which it nucleates, the resulting GaN (or III nitride material) like the exposed portions of the islands, can be expected to have relatively few defects or dislocations, a reduced level of strain and a desired polarity. As in other embodiments, additional III nitride material 28 may be deposited utilizing MOCVD or alternatively by HVPE depending on the rate of growth required and the total layer thickness desired.

Figure 5C:
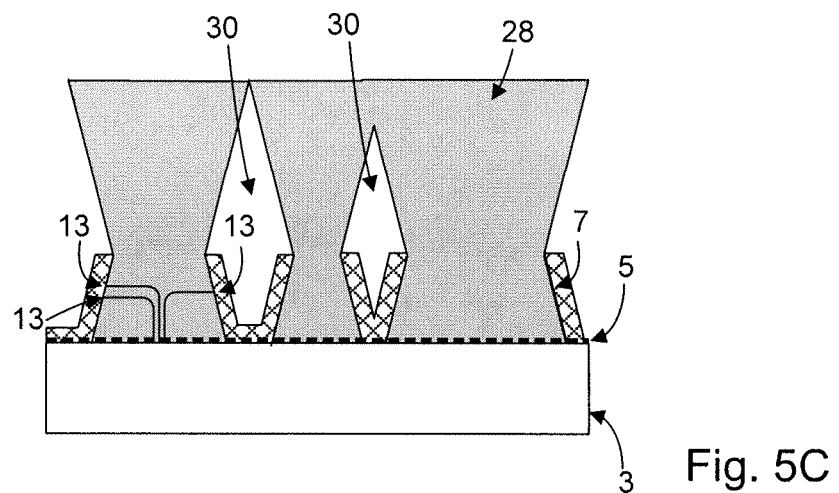

FIG. 5C illustrates the ELO growth process at the stage of coalescence of the additional III nitride material to form a continuous film. As in other embodiments the preferred spatial arrangement, spatial density, and structure of the exposed portions of the GaN islands/pillars is preferably such as to promote an ELO process, e.g. pillars have a spatial density and distribution such as to prevent crystal tilt/twist prior to coalescence thereby substantially preventing further defect formation.

The methods of the embodiment not only result in the formation of a continuous layer of III nitride material but also in the formation of voided areas 30 situated between the coalesced pillars of III nitride material. The spatial extent of the voided regions is dependent on the distribution and density of the III nitride island structures and the degree the ELO growth mode favors vertical vs. lateral growth during the ELO coalescence.

Figure 5D:
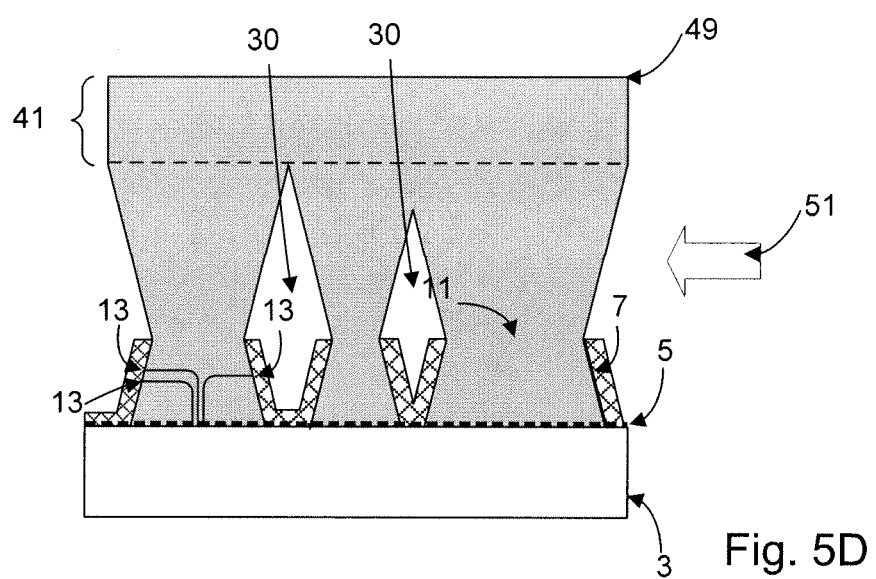

Upon coalescence of the GaN (or III nitride) film the growth mode can be altered, if desired, to more a vertical extent to produce a continuous film to a desired thickness, as shown in FIG. 5D. The thickness of the resulting layer 41 can be less than approximately 1 μm, or to approximately 100 μm, or to approximately 500 μm, or to approximately 1000 μm. The resulting GaN layer has relatively few defects or dislocations because most defects or dislocations 13 that propagated (from NL 5 on support substrate 3) into the GaN islands are hidden by the mask and cannot propagate further in the resulting GaN layer.

As in the other embodiments the resulting layer is now available for use, such as for the fabrication of electronic components, photovoltaic components, optic components, or opto-electronic components, or as a substrate for further epitaxial growth either used as-is or detached for use in composite substrates. However, an advantage of embodiment 99 over certain other embodiments is that the separation of III nitride layer 41 can be accomplished by a straightforward detachment process.

The aforementioned voided regions 30 in the structure of FIG. 5D act as localized weakened zones within the structure. It is therefore possible by the application of external energy to separate III nitride layer 41 from the remaining structure utilizing the localized voided weakened zones. In certain embodiments the separation is performed by applying an external force 51 to the structure in such way as to separate layer 41, in alternative embodiment the separation can be induced during epitaxial growth due to mismatching thermal properties of III nitride layer 41 and base substrate 3, i.e. upon post growth cool down of layer 41 the strain induced in the structure is sufficient to separate at the weakened voided zones. It should also be noted that separation can take place prior to or post bonding of surface 49 of layer 41 to a secondary carrier wafer.

Figure 6A:
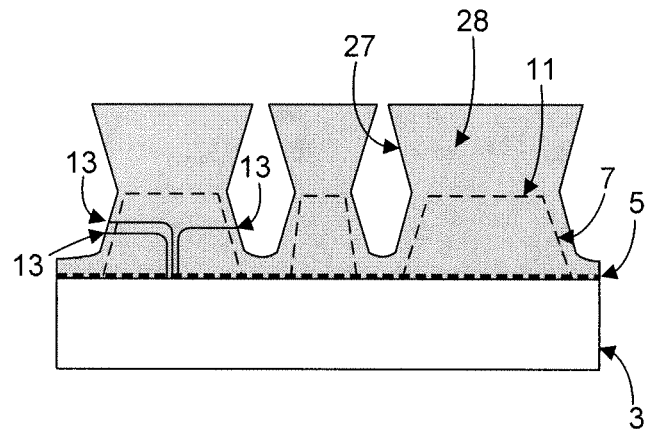
FIGS. 6A-C illustrate steps of a further alternative preferred embodiment of the invention.
Figure 6B:
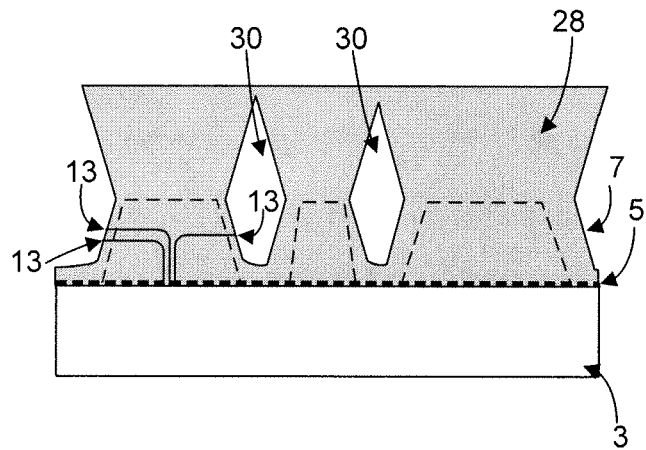
Figure 6C:
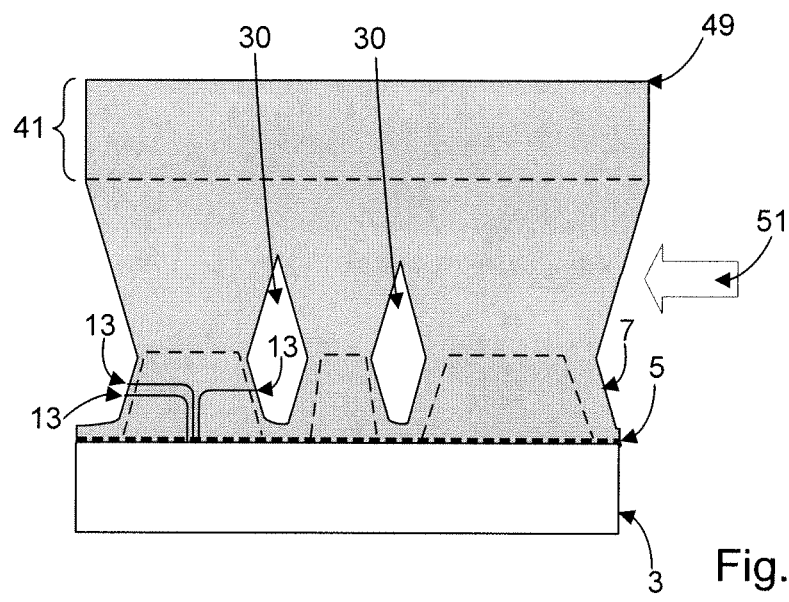

Embodiment 95 for producing the template structures is now described in conjunction with FIGS. 6A-C. In this embodiment the III nitride island structures are formed utilizing identical methods to those previously outlined (i.e. as shown in FIG. 4B) and therefore the methods are not repeated here. However, the masking layer utilized in embodiments 97 (as seen in FIGS. 4C and 5A) is omitted in the methods of embodiment 95 and the III nitride island structures and the base substrate are therefore free of masking material. A comparison of the differences with the methods of the previous embodiment is apparent upon comparison of FIG. 6A with those of FIGS. 4C and 5A.

Briefly, therefore the alternative methods of embodiment 95 differ from those of embodiments 97 in that no masking material is deposited to cover the III nitride islands or the base substrate. As a consequence of the removal of the mask deposition stage, a CMP step for removal of excess masking material is not required prior to ELO growth.

The initial stages of ELO growth directly on the structure of FIG. 4B is illustrated in FIG. 6A, wherein the profile of the original island structures (as seen in FIG. 4B) are shown in outline. The methods of the embodiment utilize the differences in growth characteristics between different crystallographic planes of the III nitride crystal. In preferred embodiments side facets 7 and base substrate 3 possess unfavorable growth characteristics in comparison to those of upper exposed surface 11 of the original III nitride island structures (illustrated in outline). As illustrated in FIG. 6A, a greater quantity of III nitride material has been deposited on the upper most surface when compared with the amount in the region of base substrate 3 and side facet 7, such growth characteristics are known in the art (see for example US 2008/0099781).

The growth conditions are therefore selected, as known in the art, to grow extensively laterally from the upper portions of the III nitride islands. Although III nitride growth originates extensively from the upper surfaces of the III nitride island there is a degree of deposition on other surfaces of the structure due to the lack of a masking material. It should be noted that due to the extensive lateral nature of the growth process defects 13 substantially remain within the same horizontal plane and do not progress vertically in the growing layer but are localized in the vicinity at the side facets of the island structures.

The degree of deposition on undesirable areas, i.e. side facets 7 and base substrate 3 can decrease with the increasing amount of additional III nitride 28 formed from the upper surface of the III nitride islands seeds. As the lateral growth process continues the additional III nitride material continues to grow laterally 27 and the growth fronts converge to the point of coalescence. During convergence of the growth fronts throughout lateral growth 27, gas phase depletion may be experienced in the areas in the vicinity of the growth substrate and the side facets due to the inability of precursor gases to effectively combine and react.

As noted in other embodiments, the additional III nitride material deposited during the ELO process 28 can be expected to inherit properties of the material on which it nucleates, the resulting GaN (or III nitride material) like the exposed portions of the islands, can be expected to have relatively few defects or dislocations, a reduced level of strain and a desired polarity. As in other embodiments, additional III nitride material 28 may be deposited utilizing MOCVD or alternatively by HVPE depending on the rate of growth required and the total layer thickness desired.

FIG. 6B illustrates the ELO growth process at the stage of coalescence of the additional III nitride material to form a continuous film. As in other embodiments the preferred spatial arrangement, spatial density, and structure of the exposed portions of the GaN islands/pillars is preferably such as to promote an ELO process, e.g. pillars have a spatial density and distribution such as to prevent crystal tilt/twist prior to coalescence thereby substantially preventing further defect formation. As in embodiment 99 the methods result in the formation of voided areas 30 situated between the coalesced pillars of III nitride material which as previously stated can be utilize in later processes for the separation of the coalesced film.

Upon coalescence of the GaN (or III nitride) film the growth mode can be altered, if desired, to more a vertical extent to produce a continuous film to a desired thickness, as shown in FIG. 6C. The thickness of the resulting layer 41 can be less than approximately 1 μm, or to approximately 100 μm, or to approximately 500 μm, or to approximately 1000 μm. The resulting GaN layer has relatively few defects or dislocations because most defects or dislocations 13 that propagated (from NL 5 on support substrate 3) into the GaN islands terminate at the side facets of the islands and are thereby substantially prevented from propagating further in the resulting GaN layer.

As in the other embodiment the resulting layer is now available for use, such as for the fabrication of electronic components, photovoltaic components, optic components, or opto-electronic components, or as a substrate for further epitaxial growth either used as-is (embodiment 91) or detached for use in composite substrates (embodiment 93). However, an advantage is that the separation of III nitride layer 41 can be accomplished by a straightforward detachment process as described in the previous embodiment, i.e. through the application of force 51 in the region of the weakened voided regions to separate layer 41.

Example 1

Figure 7A:
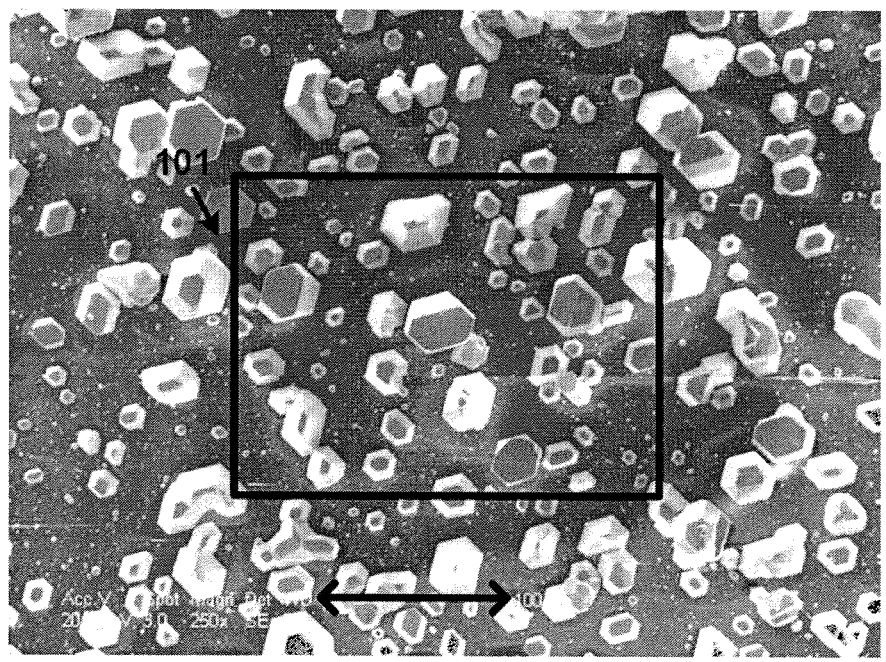
FIGS. 7A-C illustrate an example of the invention.
Figure 7B:
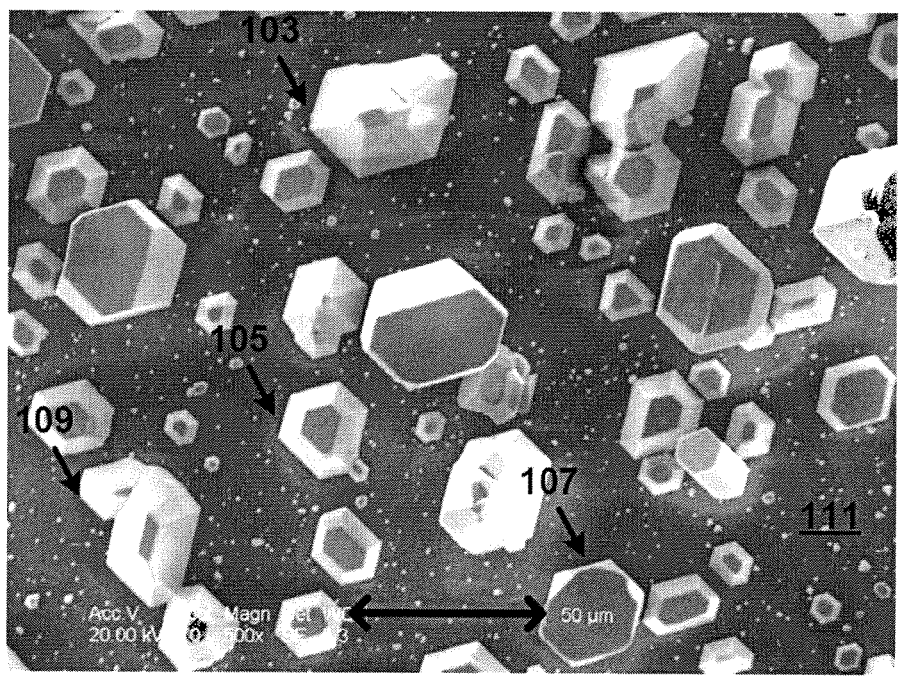
Figure 7C:
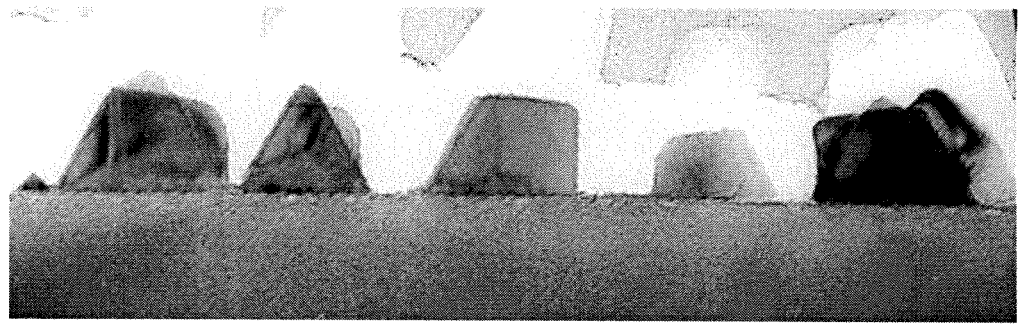

FIGS. 7A-B illustrate top views and FIG. 7C illustrates a TEM side view of an actual examples of a preferred base substrate 111 with a plurality GaN islands/pillars, in particular islands/pillar 103, 105, and 107, corresponding to the schematic illustration in FIG. 4B. The double headed arrow in FIG. 7A represent 100 μm and in FIG. 7B represents 50 μm. FIG. 7B illustrates in more detail the region of FIG. 7A within frame 101.

The island/pillar features of FIGS. 7A-C have been produced by heating a MOVPE reactor to temperature of between 800° C. to 1000° C., in preferred embodiment the temperature was maintained at 900° C. during the growth of the isolated GaN features. The pressure range during the growth was maintained between 200 Torr to 400 Torr, in preferred embodiment the pressure was maintained at 200 Torr. The ratio of V species (e.g. Ammonia) to III species (e.g. Trimethylgallium) was kept low to promote 3-D pillar growth; V/III ratios utilized were between 700-1200, preferably 800.

FIG. 7A illustrates that the pillars/islands are positioned more or less randomly and spaced apart approximately 25 μm. The pillars/islands, or small groups thereof, are separated and isolated. Most pillars/islands are individual separated and isolated. A small number have grown together into groups of 2-3 pillars/islands, e.g., group 109, which advantageously remain well separated for other pillars/islands.

FIG. 7B illustrates several individual pillars/islands in more detail. Generally, they have preferred shapes including pyramids, truncated pyramids, and pillars topped with pyramids or truncated pyramids. For example, pillar/island 103 is exemplary of numerous pillars/islands that are topped by (or are) a virtually complete pyramid. Pillar/island 105 is exemplary of numerous other pillars/islands that are topped by (or are) a truncated pyramid. On the other hand pillar/island 103 is exemplary of several pillars/islands that have more or less flat stops with no or minimal pyramidal facets. Group 109 includes three pillars/islands that are growing, or have grown together.

It is preferred that the pillars/islands comprise uppermost portions with sloping facets on roughly half their surface, such as pillar/islands 103 and 105 because such facets promote lateral growth during subsequent growth of a GaN layer under conditions favoring ELO.

FIG. 7C illustrates a cross section image produced by high resolution transmission electron microscopy of another example of a preferred base substrate with a plurality of GaN pillars/islands, which have been produced as described above. The two leftmost and single rightmost pillars/islands are actually images of foreground pillar/islands superimposed on background pillars/islands.

In this example, pillar/island-like features have approximately equal vertical and horizontal dimensions, and are separated spatially with spacing approximately equal to the horizontal dimensions of the features themselves. The features have approximately equal heights. Certain features have an approximately rectangular cross-section and can be considered more pillar-like. Certain other features have an approximately triangular cross-section and can be considered more pyramid-like. And further features have one or more sloping horizontal facets and can be considered as truncated pyramids or as columns with pyramidal tops.

Example 2

Figure 8:
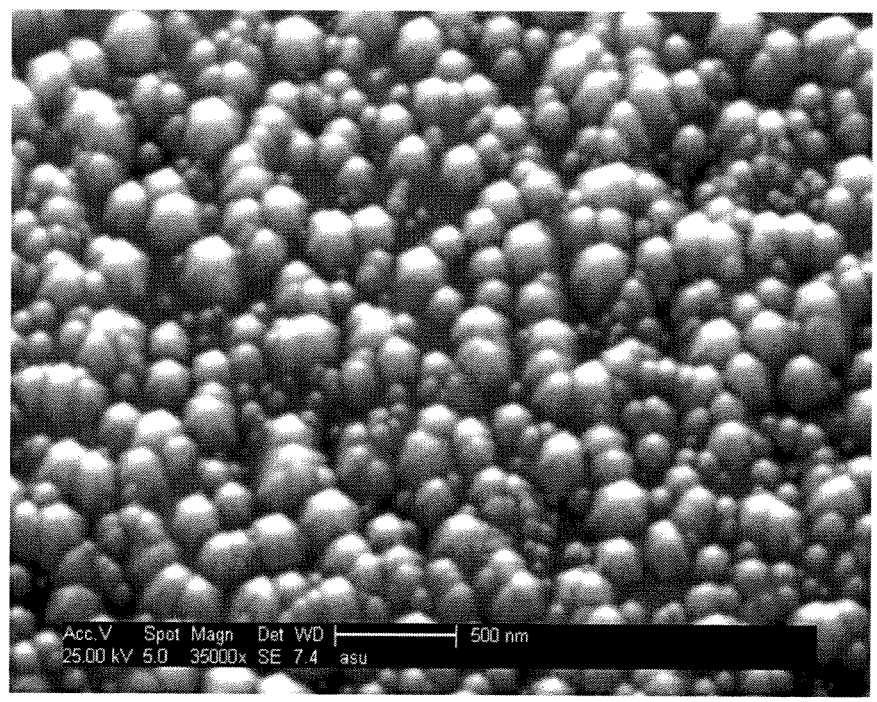
FIG. 8 illustrates a further example of the invention.

FIG. 8 illustrates an alternative embodiment for producing substantially isolated pillars/islands of a III nitride material. The GaN islands illustrated in FIG. 8 were produced by the etching of a 2D layer of III nitride material that included regions with significantly different etch resistance. The etch resistance across a III nitride layer can vary substantially depending on the crystal polarity and/or defect density in a particular area, for example growth conditions are known in the art which can lead to GaN layers with varying crystal polarity across a wafer. The etch conditions for the example shown in FIG. 8 involved the exposure of a substantially continuous GaN film to a potassium hydroxide etch solution at a temperature of 80° C. for a time period of between 6-10 minutes.

The resulting pillar/island-like features are generally spatially separated, with the underlying substrate exposed between the features, have a generally uniform maximum height, and a truncated top surface. However, it should be noted that III nitride material grown from such templates often has defect densities that are moderately higher than the defect densities of material grown on templates of the embodiment of Example 1. This is believed to result from the fact that the features are etched from a continuous layer, therefore few of the defects originating at the bottom interface of the III-V features have terminated at lateral surfaces during growth, as is the case in the embodiment of Example 1; thus more emerge at the upper portions of the islands.

The preferred embodiments of the invention described above do not limit the scope of the invention, since these embodiments are illustrations of several preferred aspects of the invention. Any equivalent embodiments are intended to be within the scope of this invention. Indeed, various modifications of the invention in addition to those shown and described herein, such as alternate useful combinations of the elements described, will become apparent to those skilled in the art from the subsequent description. Such modifications are also intended to fall within the scope of the appended claims. In the following (and in the application as a whole), headings and legends are used for clarity and convenience only.

What is claimed is:

1. A method for fabricating a layer comprising a group III nitride semiconductor material, the method comprising:
   providing a substrate comprising a plurality of islands separated in a substantially random spatial arrangement forming an irregular pattern, with the islands having upper portions with one or more selected crystal properties, and further comprising a material on which the semiconductor material preferentially nucleates and grows;
   depositing a masking material on the substrate to cover the islands and spaces therebetween;
   removing part of the masking material and islands to provide a substantially planar surface having upper portions of a majority of the islands exposed surrounded by masking material; and
   growing the semiconductor material on the substrate under conditions selected first to favor nucleation, then to favor more vertical growth of the layer material from the upper portions on the islands, then epitaxial lateral overgrowth (ELO) laterally beyond the islands from the more-vertically-grown layer material, and then coalescence to form a substantially continuous and monocrystalline final semiconductor layer that inherits one or more of the selected crystal properties.

2. The method of claim 1 wherein the masking material is selected so that the semiconductor material preferentially nucleates and grows on islands in comparison to on the masking material.

3. The method of claim 1 wherein the masking material comprises silicon nitride, or silicon oxide, or mixtures thereof.

4. The method of claim 1 wherein the step of removing part of the masking material includes removing masking material by chemical-mechanical polishing so that the upper portions of a majority of the islands are exposed.

5. The method of claim 1 wherein the step of removing part of the masking material includes performing a surface smoothing of the upper portions of the islands.

6. The method of claim 1 wherein the step of providing further comprises growing the islands under conditions selected so that a majority of the dislocations arising at the substrate bend laterally and terminate at lateral facets of the islands.

7. The method of claim 1 wherein the semiconductor material is the same or different than the island material, and wherein the semiconductor material comprises aluminum nitride, or gallium nitride, or indium nitride, or a mixture thereof.

8. The method of claim 1 wherein the semiconductor material comprises GaN, and wherein the selected crystal properties comprise one or more of a surface density of defects or dislocations of approximately $10^8/cm^2$ or less, a percentage of relaxation in the lattice strain of at least 5%, and a crystal polarity selected to be one of +c (Ga-face) or a −c (N-face) orientation.

9. The method of claim 1 wherein the islands are grown under further conditions selected so that their lateral facets and upper surfaces present crystal orientations that discourage nucleation and growth of the layer material on the lateral facets in comparison to upper surfaces.

10. The method of claim 1 wherein, after coalescence of the semiconductor material, the growing conditions are further selected to favor more vertical growth until a selected thickness of the final layer is reached.

11. The method of claim 1 wherein the plurality of separated islands are provided by growing the island material directly on the base substrate under conditions selected so that it is deposited in the form of separated islands in an irregular pattern with a substantially random spatial arrangement.

12. The method of claim 1 wherein the islands comprise the semiconductor material.

13. The method of claim 1 wherein the islands have a spatial density so that the final layer is substantially monocrystalline.

14. The method of claim 1 wherein the semiconductor material comprises an elemental semiconductor material, or an alloy semiconductor material, or a Group II-VI compound semiconductor material, or a Group III-V compound semiconductor material.

15. The method of claim 1 wherein the selected crystal properties comprise one or more of a low density of crystal defects, a selected crystal polarity, and a reduced crystal strain.

16. The method of claim 1 further comprising detaching a portion of the final semiconductor layer.

17. The method of claim 1 wherein the upper portions of the islands favor growth in the [001] or +c direction.

18. The method of claim 16 wherein detaching further comprises:
    forming a zone of weakness within the final semiconductor layer; and
    applying energy to detach a portion of the final semiconductor layer at the zone of weakness.

19. The method of claim 16 wherein the detached layer has substantially a single crystal polarity.

* * * * *